United States Patent [19]
Nakamura et al.

[11] Patent Number: 6,002,592
[45] Date of Patent: Dec. 14, 1999

[54] ELECTRONIC DEVICE AND METHOD FOR MANUFACTURING ELECTRONIC DEVICE

[75] Inventors: Toshifumi Nakamura, Tokyo; Naoji Nada, Kanagawa; Katsuhiro Yoneyama, Chiba, all of Japan

[73] Assignee: Sony Corporation, Tokyo, Japan

[21] Appl. No.: 08/987,106

[22] Filed: Dec. 8, 1997

[30] Foreign Application Priority Data

Dec. 9, 1996 [JP] Japan ..................... 8-328746
May 30, 1997 [JP] Japan ..................... 9-157385

[51] Int. Cl.⁶ ................. H05K 1/18; H05K 3/30
[52] U.S. Cl. ............... 361/760; 361/684; 361/736; 361/772; 361/777; 361/748; 174/50.1; 174/50.54; 174/52.2
[58] Field of Search ............... 361/760, 752, 361/684, 736, 772, 774, 777, 778, 730, 728, 748; 174/50, 50.1, 50.5, 52.1, 52.2, 50.6

[56] References Cited

U.S. PATENT DOCUMENTS

| | | | |
|---|---|---|---|
| 5,013,900 | 5/1991 | Hoppe | 235/492 |
| 5,036,431 | 7/1991 | Adachi et al. | 361/803 |
| 5,280,413 | 1/1994 | Pai | 361/792 |
| 5,581,130 | 12/1996 | Boucheron | 307/10.1 |
| 5,699,232 | 12/1997 | Neidig et al. | 361/752 |

*Primary Examiner*—Leo P. Picard
*Assistant Examiner*—David Foster
*Attorney, Agent, or Firm*—Hill & Simpson

[57] ABSTRACT

An semiconductor device and a method for manufacturing semiconductor devices which are easily made compact. A plurality of semiconductor chips having protrusion electrodes respectively provided on a plurality of electrodes formed on circuit surfaces are integrally sealed by an insulating material so as to cover the circuit surfaces while the circuit surfaces are nearly directed to the same direction and arranged in prescribed conditions, and to expose the respective protrusion electrodes; and insulating layers and wiring layers respectively electrically connected to the corresponding protrusion electrodes are alternately laminated on the insulating material so as to have the desired number of layers in the direction of thickness. Thus, the spaces between the semiconductor chips can be extremely narrowed, and the thickness of the insulating layers and wiring layers can be significantly reduced, so that the semiconductor devices which can be made compact without difficulty and the method capable of easily manufacturing the semiconductor devices in compact forms can be realized.

10 Claims, 19 Drawing Sheets

ELECTRONIC DEVICE AND METHOD FOR MANUFACTURING ELECTRONIC DEVICE

BACKGROUND OF THE INVENTION

1. Field of the Invention

This invention relates to an electronic device and a method for manufacturing electronic parts, and more particularly is applicable to a multichip module and a method for manufacturing the multichip module.

2. Description of the Related Art

Conventionally, as such electronic device, there has been known a multichip module in which a plurality of chip parts are mounted with high density on a multilayer wiring substrate and an entire body is thus made compact, so that the wiring length between the respective chip parts can be relatively shortened and the high speed characteristic and high frequency characteristic or the like of the respective chip parts can be improved.

As illustrated in FIG. 1, a multichip module 1 ordinarily comprises a multilayer wiring substrate 2 formed by sequentially laminating and forming insulating layers composed of ceramic substrates or organic substrates or the like and wiring layers having prescribed conductor patterns in the direction of its thickness, a plurality of chip parts 3 formed on one surface 2A of the multilayer wiring substrate 2, and protrusion electrodes 4 (referred to as soldering bumps, hereinafter) obtained by soldering a plurality of pads (not shown) respectively formed on circuit surfaces 3A of corresponding lands (not shown) on the multilayer wiring substrate 2. The respective chip parts 3 are electrically and physically connected to and mounted on the one surface 2A of the multilayer wiring substrate 2 through the soldering bumps 4.

In this connection, in the multichip module 1, since the coefficient of thermal expansion of the multilayer wiring substrate 2 has a value not smaller than two times the coefficient of thermal expansion of the chip parts 3, if the chip parts 3 generate heat owing to the operation of the chip parts 3 and so on, thermal stress may be concentrated on the respective soldering bumps 4 formed between the multilayer wiring substrate 2 and the respective chip parts 3, which may cause inconveniently the soldering bumps 4 to be broken.

For overcoming this disadvantage, in the above mentioned multichip module 1, spaces formed between the one surface 2A of the multilayer wiring substrate 2 and the circuit surfaces 3A of the respective chip parts 3 are respectively filled with an insulating material (namely, an underfilling material) 5 so as to embed the respective soldering bumps 4 therein. Thus, according to the above stated multichip module 1, the concentration of the thermal stress generated on the respective soldering bumps 4 can be mitigated because of the insulating material 5, so that the soldering bumps 4 can be prevented from being broken. Further, the insulating material 5 is designed to cover the respective circuit surfaces 3A of the chip parts 3 so that it can protect the circuit surfaces 3A from troubles due to impurities or moisture contained in outside air as well as can prevent the breakage of the respective soldering bumps 4.

In recent years, in the multichip module 1 described above, it has been desired that the construction of a multichip module 1 is made more compact, in order to mount the respective chip parts 3 on the one surface 2A of the multilayer wiring substrate 2 with a higher density.

However, according to the multichip module 1 in question, when the spaces between the respective chip parts 3 are narrowed in some degree or more, there have occurred problems that it is difficult to fill the spaces between the one surface 2A of the multilayer wiring substrate 2 and the respective circuit surfaces 3A of the chip parts 3 with the insulating material 5 so that the insulating material 5 hardly prevents the breakage of the respective soldering bumps 4, and that the circuit surfaces 3A of the respective chip parts 3 are seldom protected. Accordingly, when the respective chip parts 3 are mounted on the substrate with a higher density and the size of the multichip module 1 is made smaller, there has arisen a problem that quality and reliability of the multichip module 1 are disadvantageously degraded markedly.

In addition, in the above multichip module 1, when the number of the chip parts 3 mounted on the one surface 2A of the multilayer wiring substrate 2 is increased, a heat generation rate of the entire module depending on the operation of the respective chip parts 3 is also increased, so that the thermal stress converged to the respective soldering bumps 4, which results from the difference in the coefficient of thermal expansion between the multilayer wiring substrate 2 and the chip parts 3, is hardly lowered only by the insulating material 5. Therefore, in such a case, a method may be considered for mitigating the thermal stress concentrated onto the respective soldering bumps 4 by relatively enlarging the size of the respective bumps 4, in addition to the insulating material 5.

However, in the above mentioned case, the lands of the multilayer wiring substrate 2 have needed to be enlarged depending on the dimension of the soldering bumps 4, and therefore, the multilayer wiring substrate 2 has been undesirably made larger. In other words, the multilayer wiring substrate 27 has been enlarged, which has inconveniently caused the entire body of the multichip module 1 to be also enlarged.

Additionally, in the above described multichip module 1, when the number of the pads of the chip parts 3 mounted on the one surface 2A of the multilayer wiring substrate 2 is comparatively large, the number of wirings electrically connected to the lands of the multilayer wiring substrate 2 is also proportionally increased. Therefore, the number of wiring layers formed on the multilayer wiring substrate 2 must be increased.

In this case, however, since the insulating layers to be increased together with the wiring layers in the multilayer wiring substrate 2 has approximately 0.1 mm per layer, the multilayer wiring substrate 2 has been undesirably comparatively increased in its thickness.

SUMMARY OF THE INVENTION

In view of the foregoing, an object of this invention is to provide an electronic device which can be easily made compact and a method for manufacturing the electronic device.

The foregoing object and other objects of the first aspect of the present invention have been achieved by the provision of an electronic device, which comprises: a plurality of chip parts having protrusion electrodes respectively provided on a plurality of electrodes formed on the circuit surfaces; insulating materials for integrally sealing the respective chip parts, which are arranged in prescribed conditions with the circuit surfaces nearly directed to the same direction, so as to cover the circuit surfaces and respectively expose the protrusion electrodes; insulating layers composed of insulating substance and wiring layers having prescribed conductor patterns which are sequentially and alternately laminated on the insulating materials; a first conductively connecting means for conductively connecting together the protrusion electrodes and the wiring layers respectively corresponding thereto; and a second conductively connecting means for conductively connecting between the predetermined wiring layers.

Further, according to the second aspect of the present invention, there is provided connecting means for connecting a plurality of electronic devices which are laminated and arranged. The electronic device comprises: a plurality of chip parts having protrusion electrodes respectively provided on a plurality of electrodes formed on the circuit surfaces; insulating materials for integrally sealing the plurality of chip parts, which are arranged in prescribed conditions with the circuit surfaces nearly directed to the same direction, so as to cover the circuit surfaces and respectively expose the protrusion electrodes; insulating layers composed of insulating substance and wiring layers having prescribed conductor patterns which are sequentially and alternately laminated on the insulating materials; a first conductively connecting means for conductively connecting together the protrusion electrodes and the wiring layers respectively corresponding thereto; and a second conductively connecting means for conductively connecting between the predetermined wiring layers.

Further, according to the third aspect of the present invention, there is provided a method for manufacturing electronic devices, which comprises: a first step of integrally sealing a plurality of chip parts, which are arranged in prescribed conditions with the circuit surfaces are nearly directed to the same direction, having protrusion electrodes respectively provided on a plurality of electrodes formed on the circuit surfaces so as to cover the circuit surfaces, and respectively expose the protrusion electrodes; a second step of sequentially and alternately laminating and forming on the insulating materials insulating layers composed of a prescribed insulating substance and wiring layers having prescribed patterns; and a third step of conductively connecting the protrusion electrodes and the wiring layers corresponding thereto.

Further, according to the fourth aspect of the present invention, there is provided a method for manufacturing electronic devices, which comprises: a first step of integrally sealing a plurality of chip parts, which are arranged in prescribed conditions with the circuit surfaces nearly directed to the same direction, having protrusion electrodes respectively provided on a plurality of electrodes formed on the circuit surfaces, so as to cover the circuit surfaces and respectively expose the protrusion electrodes; a second step of sequentially and alternately laminating insulating layers composed of a prescribed insulating substance and wiring layers having prescribed patterns on the insulating materials; a third step of conductively connecting the protrusion electrodes and the wiring layer corresponding thereto; and a fourth step of laminating the insulating materials of which the insulating layers and the wiring layers are laminated and formed in the direction of its thickness, and of electrically connecting the chip parts which are sealed with the insulating materials and the chip parts which are sealed with other insulating materials.

Thus, according to the first aspect of the invention, electronic devices comprises: a plurality of chip parts of which protrusion electrodes are provided on each of electrodes of the circuit surfaces; insulating materials for integrally sealing the chip parts, which are arranged in prescribed conditions with the circuit surfaces nearly directed to the same direction, so as to cover the circuit surfaces and respectively expose the protrusion electrodes; insulating layers composed of insulating substance and wiring layers having prescribed conductor patterns which are sequentially and alternately laminated on the insulating materials; first conductively connecting means for conductively connecting together the protrusion electrodes, the wiring layers respectively corresponding thereto; and second conductively connecting means for conductively connecting between predetermined wiring layers. Therefore, the respective circuit surfaces of the chip parts and the respective protrusion electrodes can be substantially assuredly covered with the insulating materials.

Thus, according to the second aspect of the present invention, there is provided connecting means for connecting a plurality of electronic devices which are laminated and arranged, so that the size of the laminated plurality of electronic devices can be made almost equal to that obtained only by laminating respective electronic devices. The electronic device comprises: a plurality of chip parts of which protrusion electrodes are provided on respective electrodes of the circuit surfaces; insulating materials for integrally sealing the chip parts, which are arranged in prescribed conditions with the circuit surfaces nearly directed to the same direction, so as to cover the circuit surfaces and respectively expose the protrusion electrodes; insulating layers composed of insulating substance and wiring layers having prescribed conductor patterns which are sequentially and alternately laminated on the insulating materials; first conductively connecting means for conductively connecting together the protrusion electrodes, the wiring layers respectively corresponding thereto; and second conductively connecting means for conductively connecting between predetermined wiring layers.

Thus, according to the third aspect of the present invention, a plurality of chip parts of which protrusion electrodes are respectively provided on respective electrodes of circuit surfaces are integrally sealed with insulating materials so as to cover the circuit surfaces while the circuit surfaces are nearly directed to the same direction and arranged in prescribed conditions, and to expose the respective protrusion electrodes. Then, the insulating layers and wiring layers which are electrically connected to the corresponding protrusion electrodes are alternately laminated and formed on the insulating materials respectively so as to have the desired number of layers in the direction of thickness. Therefore, the spaces formed between the respective chip parts can be extremely narrowed, and the thickness of the insulating layers and wiring layers can be significantly reduced.

Thus, according to the fourth aspect of the present invention, a plurality of chip parts of which protrusion electrodes are respectively provided on a plurality of electrodes formed on circuit surfaces are integrally sealed with insulating materials so as to cover the circuit surfaces while the circuit surfaces are nearly directed to the same direction and arranged in prescribed conditions, and to expose the respective protrusion electrodes; insulating layers composed of a prescribed insulating substance and wiring layers having prescribed conductor patterns respectively electrically connected to the corresponding protrusion electrodes are sequentially and alternately laminated and formed on the plurality of insulating materials, which seal the respective chip parts, so as to have the desired number of layers in the direction of thickness; the respective insulating materials on which the insulating layers and the wiring layers are laminated and formed is sequentially laminated in the direction of thickness; and the corresponding chip parts of the chip parts respectively sealed by the insulating materials are electrically connected together. Therefore, the spaces between the respective chip parts of relatively large scale electronic devices can be extremely narrowed, and the thickness of the insulating layers and wiring layers can be extraordinarily reduced.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 2:
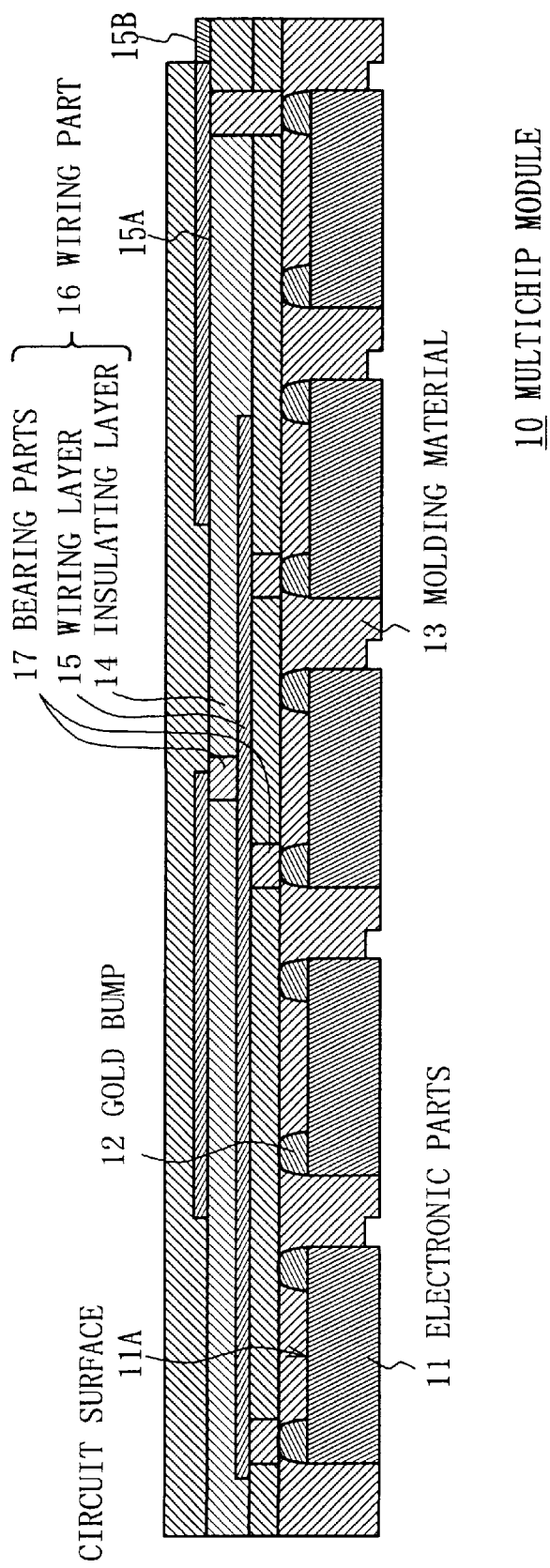
FIG. 2 is a schematic sectional view showing a first embodiment of the construction of a multichip module according to the present invention.

Preferred embodiments of this invention will be described with reference to the accompanying drawings:

(1) First Embodiment (1-1) Construction of multichip module according to the first embodiment In FIG. 2, 10 generally designates a multichip module according to the first embodiment to which the present invention is applied. A plurality of chip parts 11 respectively having gold bumps 12 provided on a plurality of pads (not illustrated) formed on circuit surfaces 11A are integrally sealed by a molding material 13 composed of an epoxy resin or the like, while the circuit surfaces 11A are nearly directed to the same direction and arranged in prescribed conditions, so as to cover the respective circuit surfaces 11A and respectively expose the upper end parts of the gold bumps 12. Further, on the molding material 13, a wiring part 16, is provided, which comprises insulating layers 14 composed of polyimide resin, etc. and wiring layers 15 formed with prescribed conductor patterns sequentially and alternately laminated so as to located an insulating layer 14 at an uppermost layer.

In this case, in the wiring part 16, the respective gold bumps 12, the wiring layers 15 respectively corresponding thereto and the respective wiring layers 15 are electrically conductively connected together through bearing parts 17.

Additionally, in the wiring part 16, a plurality of external terminals 15B composed of the end parts of conductor patterns are located along and in one end 13 side of a wiring layer 15A located in the uppermost layer among the wiring layers 15. The insulating layer 14 is laminated and formed on the wiring layer 15A located on the uppermost layer so as to expose the external terminals 15B.

In this way, in the multichip module 10, the respective external terminals 15B are electrically connected to the relevant electrodes of a mother board (not shown), so that a signal can be inputted to the respective chip parts 11 from the mother board or a signal can be outputted to the mother board from the chip parts 11 sequentially through the gold bumps 12 corresponding thereto, the wiring layers 15, the bearing parts 17 and the external terminals 15B. In addition thereto, in the multichip module 10, the probe (not illustrated) of an inspection device is applied to the respective external terminals 15B so that whether the wiring layers 15 and the bearing parts 17 respectively corresponding to the external terminals 15B are disconnected therefrom or not, whether the gold bumps 12 are broken or not, and further, whether the chip parts 11 have troubles or not can be inspected.

(1-2) Procedure for manufacturing multichip module

In practice, the multichip module 10 can be manufactured in accordance with the following procedures shown in FIG. 3A to FIG. 6.

Figure 3A:
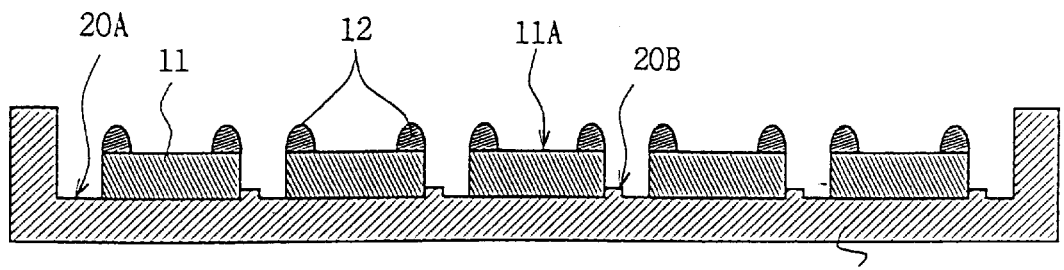
FIGS. 3A to 3D are schematic sectional views showing a manufacturing procedure of the mold sheet of the multichip module according to the first embodiment.

Initially, as illustrated in FIG. 3A, the gold bumps 12 are respectively formed on a plurality of pads provided on the circuit surfaces 11A of the relevant chip parts 11. Then, the respective chip parts 11 are arranged in prescribed conditions and positioned on the bottom part 20A of a mold die 20 so as to direct the respective circuit surfaces 11A upward.

In this case, a plurality of positioning parts 20B protruding on the bottom part 20A of the mold die 20 are provided. End sides of the peripheral side surfaces of the chip parts 11 respectively abut against the positioning parts 20B. Thus, the respective chip parts 11 can be arranged and positioned at 14 prescribed intervals and in prescribed conditions.

Figure 1:
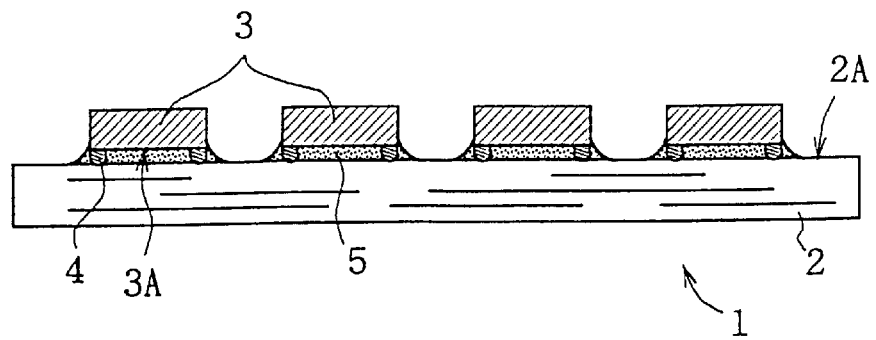
FIG. 1 is a schematic sectional view showing the construction of a conventional multichip module.
Figure 3B:
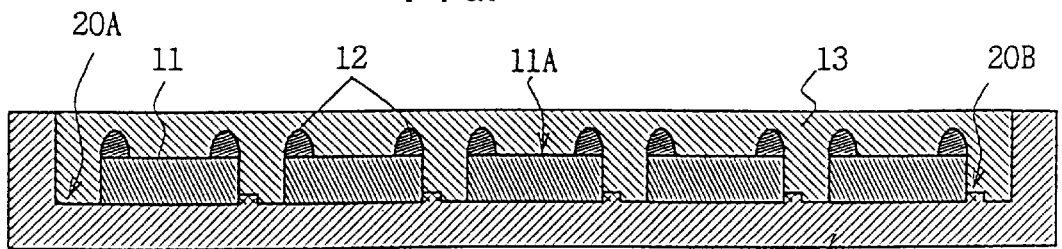

As illustrated in FIG. 3B, the mold die 20 is filled with the molding material 13 composed of an epoxy resin or the like so as to embed the respective chip parts 11 and the respective gold bumps 12 therein. In this connection, the mold die 20 is filled with the molding material 13 from the respective circuit surface 11A sides of the chip parts 11. Accordingly, the circuit surfaces 11A of the chip parts 11 can be assuredly covered with the molding material 13 regardless of the spaces between the respective chip parts 11. Therefore, the spaces formed between the chip parts 11 can be made extremely narrower than those between respective chip parts 3 of a conventional multichip module 1 (FIG. 1).

Then, the mold die 20 filled with the molding material 13 is put in a predetermined heating furnace (not shown) the inside of which is maintained at a predetermined temperature and heated for a predetermined time. Thus, the molding material 13 in the mold die 20 is hardened.

Figure 3C:
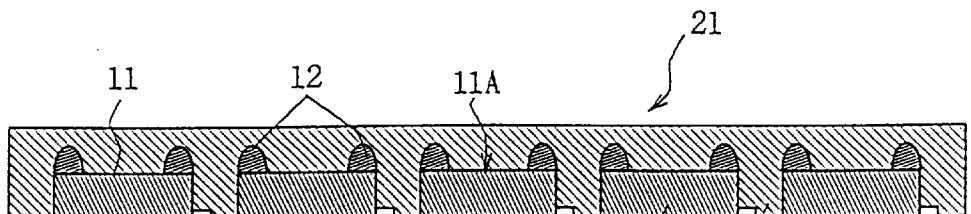

Subsequently, as shown in FIG. 3C, after the molding material 13 in the mold die 20 is hardened, the hardened molding material 13 (this is called a mold sheet, hereinafter) 21 is taken out from the mold die 20.

Figure 3D:
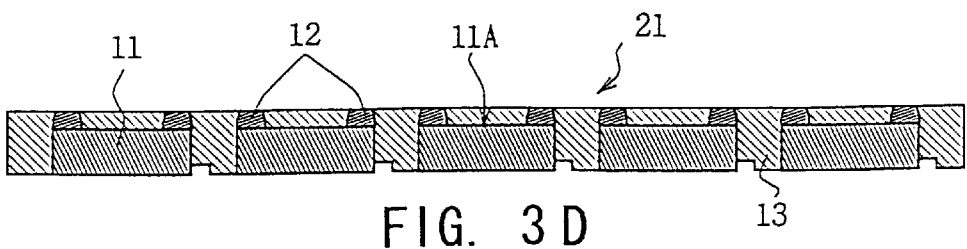
Figure 4:
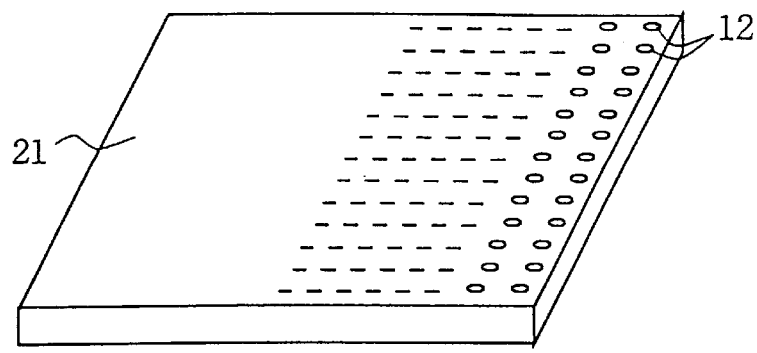
FIG. 4 is a schematic perspective view for explaining the mold sheet whose upper surface is polished.

Next, as illustrated in FIG. 3D and FIG. 4, the upper surface of the mold sheet 21 is polished by a polishing machine (not illustrated) so that the height of the gold bumps 12 is respectively uniformed, and the upper parts of the gold bumps 12 are exposed. In such a way, the mold sheet 21 can be formed, which seals integrally the chip parts 11 so as to cover the circuit surfaces 11A therewith and expose the upper parts of the respective gold bumps 12.

Figure 5A:
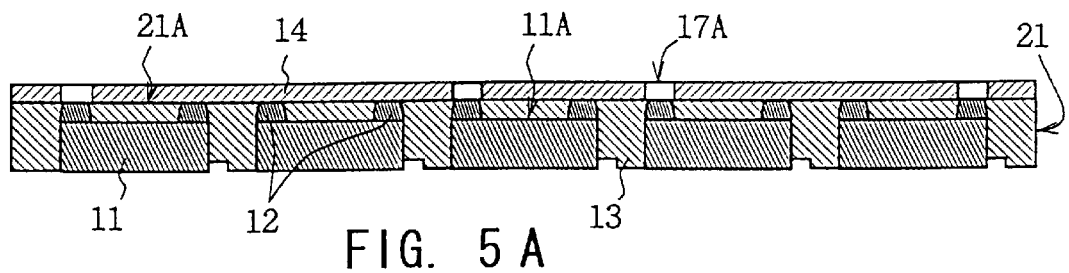
FIGS. 5A and 5B are schematic sectional views showing a manufacturing procedure of a wiring part of the multichip module according to the first embodiment.

After that, as illustrated in FIG. 5A, the polyimide resin is dropped or applied onto the polished surface 21A of the mold sheet 21. Then, the polished surface 21A of the mold sheet 21 is coated with the polyimide resin having a substantially uniform thickness of about 30 to 50 $\mu$m in accordance with a spin coating method. Then, the mold sheet 21 is put in a prescribed heating furnace (not shown) whose inside temperature is maintained at a prescribed temperature and heated for a prescribed time. Thus, the polyimide resin is solidified, and through holes 17A respectively having a prescribed diameter are formed at prescribed positions on the solidified polyimide resin which respectively correspond to the gold bumps 12, under a prescribed photoprocessing method, so that the insulating layer 14 made of the polyimide resin is formed on the polished surface 21A of the mold sheet 21.

Figure 5B:
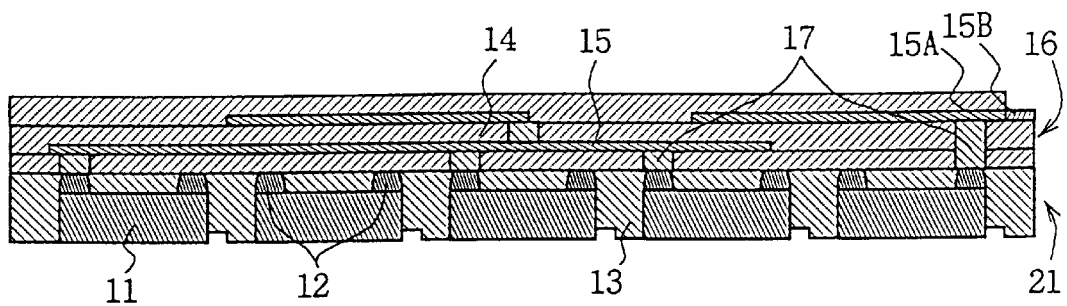

Next, as seen in FIG. 5B, copper is sputtered onto the insulating layer 14 and into the inner peripheral surfaces of the respective through holes 17A by using a prescribed sputtering device (not shown). Thus, a copper foil having a prescribed thickness is laminated and formed on the insulating layer 14, and a plurality of bearing parts 17 are formed on the insulating layer 14. Then, the copper foil is subjected to a patterning process under a phtoprocessing treatment. Thus, the wiring layer 15 composed of conductor patterns electrically conductively connected to the respectively corresponding bearing parts 17 is formed on the insulating layer 14.

Figure 6:
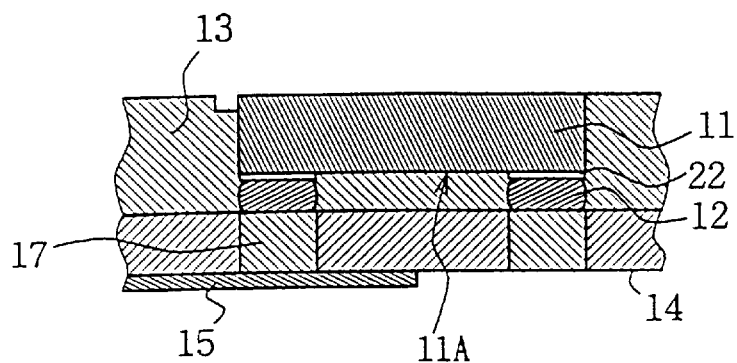
FIG. 6 is a schematic sectional view for explaining chip parts provided on the multichip module.

Thus, as shown in FIG. 6 the pads 22 of the respective chip parts 11 are conductively connected to the corresponding wiring layer 14 sequentially through the respectively corresponding gold bumps 12 and bearing parts 17.

Then, the operations shown in FIGS. 5A and 5B are repeated as required so that the insulating layers 14 and the wiring layers 15 are sequentially and alternately laminated and formed on the wiring layer 15, so as to locate the wiring layer 15A having a plurality of external terminals 15B composed of the end parts of the conductor patterns at an uppermost layer. Subsequently, the polyimide resin is dropped or applied onto the wiring layer 15A at the uppermost layer. Then, the wiring layer 15A is coated with the polyimide resin in accordance with a spin coating method.

Then, the mold sheet 21 is put in the prescribed heating furnace (not illustrated) and heated for a prescribed time to harden the polyimide resin. Thus, the insulating layer 14 is laminated and formed on the wiring layer 15A at the uppermost layer. A prescribed end side of the insulating layer 14 laminated and formed on the uppermost wiring layer 15A is peeled off so as to have a prescribed width in accordance with a prescribed photoprocessing treatment. Thus, the respective external terminals 15B of the uppermost wiring layer 15A are exposed. In this way, the wiring part 16 comprising the insulating layers 14 and the wiring layers 15 which are sequentially and alternately laminated and formed is configured on the mold sheet 21, so that the multichip module 10 can be manufactured.

(1-3) Operation and effects according to the first embodiment

According to the above stated formation, in the multichip module 10, the chip parts 11 having gold bumps 12 formed on the respective pads are arranged and positioned on the bottom part 20A of the mold die 20 in prescribed conditions and at prescribed intervals so as to direct respectively the circuit surfaces 11A upward (FIG. 3A). Then, the mold die 20 is filled with the molding material 13 by which the respective chip parts 11 and the respective gold bumps 12 are integrally sealed so as to be embedded therein (FIG. 3B).

After that, the mold sheet 21 is taken out from the mold die 20 (FIG. 3C). The upper surface of the taken out mold sheet 21 is polished so that the upper parts of the gold bumps 12 are exposed (FIG. 3C and FIG. 4). Then, the insulating layer 14 having the bearing holes or through holes 17A formed at prescribed positions is laminated and formed on the polished surface 21A of the mold sheet 21 (FIG. 5A). Subsequently, the wiring layer 15 composed of conductor patterns electrically conductively connected through the respectively corresponding gold bumps 12 and bearing parts or through hole parts 17 is laminated and formed on the insulating layer 14. Then, the insulating layers 14 and the wiring layers 15 are sequentially and alternately laminated and formed, if necessary, so as to locate the insulating layer 14 at an uppermost layer. In this manner, the multichip module 10 in which the wiring part 16 is laminated and formed on the mold sheet 21 can be produced.

Therefore, according to the procedure of manufacturing the multichip module 10, since the respective chip parts 11 are arranged and positioned on the bottom part 20A of the mold die 20 at prescribed intervals and in prescribed states, and the mold die 20 is filled with the molding material 13 from the circuit surface 11A sides of the chip parts 11 so as to embed the chip parts 11 and the gold bumps 12 therein, the circuit surfaces 11A of the chip parts 11 and the gold bumps 12 can be substantially assuredly covered with the molding material 13 regardless of the spaces between the chip parts 11. Thus, the respective chip parts 11 can be arranged with spaces extremely narrower than those of the chip parts 3 of the conventional multichip module 1 (FIG. 1).

Besides, the circuit surfaces 11A of the chip parts 11 can be substantially effectively protected from impurities and moisture contained in outside air because of the presence of the molding material 13, and therefore, the quality and reliability of the multichip module 10 can be improved.

Further, according to the procedure of manufacturing the multichip module 10, since the wiring layer 15 composed of prescribed conductor patterns is formed with the copper foil in accordance with the prescribed photoprocessing method, the conductor patterns of the wiring layers 15 can have their conductor width and spaces between conductors of approximately 20 to 30 μm. Thus, the wiring layer can be can be formed with a density relatively higher than that in the wiring layer of the multilayer wiring substrate 2 (FIG. 1) of the conventional multichip module 1, and therefore, the wiring part 16 can be made compact.

Still further, since the thickness per layer of the insulating layers 14 is designed to be about 30 to 50 μm, the thickness of the insulating layer 14 can be made extremely thinner than that per layer of the insulating layers of the conventional multichip module 1. Accordingly, when the wiring part 16 of the present embodiment composed of the same number of layers as that of the wiring part of the multilayer wiring substrate 2 of the conventional multichip module 1 is compared therewith, the thickness of the wiring part 16 of the present embodiment can be apparently significantly decreased.

Therefore, the multichip module 10 manufactured in accordance with the above mentioned manufacturing procedure is provided with the chip parts 11 having spaces therebetween which are extremely smaller than, and the wiring part 16 significantly thinner than those of the conventional multichip module 1, and formed in a compact shape. Accordingly, the multichip module 10 of the present embodiment can be made compact and the weight thereof can be reduced. Thus, according to the above described multichip module 10 of the present embodiment, even when the number of pads provided on the respective chip parts 3 is comparatively large, the former can be made smaller than the conventional multichip module 1 provided with the same number of similar chip parts 2.

Still further, according to the multichip module 10 of the present embodiment of the invention, since the module 10 is provided with the wiring layers 14 composed of the polyimide resin with a coefficient of thermal expansion relatively lower than that of the insulating layers composed of the insulating substrate or organic substrate or the like used for the multilayer wiring substrate 2 of the conventional multichip module 1, thermal stress concentrated to the respective gold bumps 12 can be mitigated only by the molding material 13 without enlarging the bumps 12, and the gold bumps 12 can be prevented from being broken, even when the extremely large number of chip parts 11 are provided, as compared with that of the chip parts 3 (FIG. 1) provided on the conventional multichip module 1. Thus, the quality and reliability of the multichip module 10 can be improved.

Still further, according to the multichip module 10 of the present embodiment, since the respective external terminals 15B are provided on one end side of the upper surface of the wiring part 16, the presence or absence of the disconnections of the wiring layers 15 and the bearing parts 17, the presence or absence of the breakage of the gold bumps 12, and further, the presence or absence of failures of the chip parts 11 or the like can be readily inspected through the external terminals.

According to the above mentioned formation, there are provided a plurality of chip parts 11 having the gold bumps 12 provided on the respective pads of the circuit surfaces 11A, the molding material 13 for integrally sealing the respective chip parts 11 arranged in prescribed conditions while their circuit surfaces 11A are directed to the same direction so as to cover the respective circuit surfaces 11A and expose the upper end parts of the gold bumps 12, the wiring part 16 including the insulating layers 14 and the wiring layers 15 which are sequentially and alternately laminated and configured on the molding material 13 and the bearing parts 17 through which the gold bumps 12, the wiring layers 15 respectively corresponding thereto and spaces between the wiring layers 15 respectively corresponding thereto are electrically conductively connected together. Thus, the circuit surfaces 11A of the chip parts 11 and the respective gold bumps 12 can be almost surely covered with the molding material 13, so that electronic devices which can be readily made compact can be realized.

Furthermore, the chip parts 11 having the gold bumps 12 respectively provided on the pads of the circuit surfaces 11A are arranged in prescribed states with the circuit surfaces 11A directed to the same direction and integrally sealed by the molding material 13 so as to cover the circuit surfaces 11A and expose the upper end parts of the gold bumps 12, and then, the insulating layers 14 and the wiring layers 15 which are electrically conductively connected thereto through the respectively corresponding gold bumps 12 and bearing parts 17 are laminated and formed on the molding material 13 so as to have the desired number of layers in the direction of thickness. Thus, the spaces between the chip parts 11 can be greatly narrowed and the thickness of the wiring part 16 can be extremely reduced, so that a method for manufacturing electronic devices capable of easily producing compact electronic devices can be realized.

Figure 7:
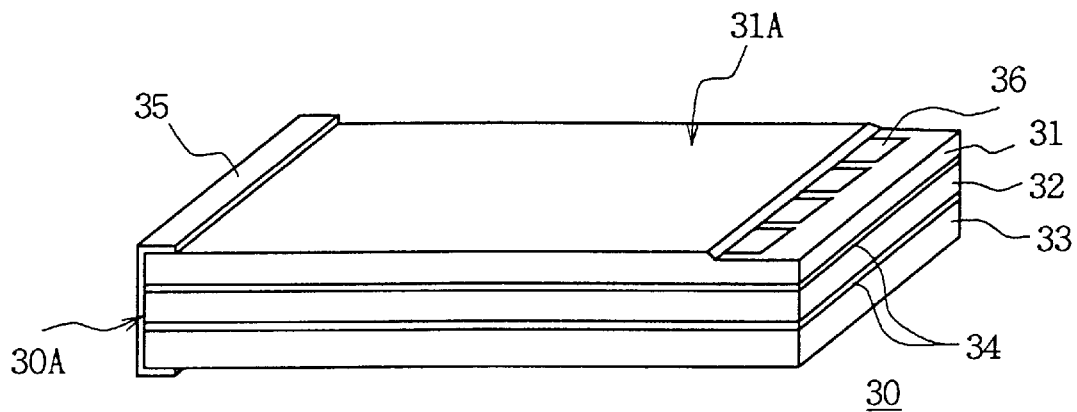
FIG. 7 is a schematic sectional view showing the construction of a multilayer multichip module according to a second embodiment.

(2) Second Embodiment (2-1) Construction of multilayer multichip module according to a second embodiment FIG. 7 illustrates a multilayer multichip module 30 according to a second embodiment. In this figure, a plurality of multichip modules 31 to 33 are sequentially laminated and formed through an adhesive agent 34 in the direction of thickness. The wiring line (not shown) having a prescribed pattern for electrically connecting together the respective multichip modules 31 to 33 and a protective film 35 for protecting the wiring line are formed on a peripheral side surface 30A. A plurality of external terminals 36 are provided in one end side opposed to the peripheral side surface 30A on the upper surface 31A of the multichip module 31 located at an uppermost layer (this is called a first multichip module, hereinafter).

Figure 8:
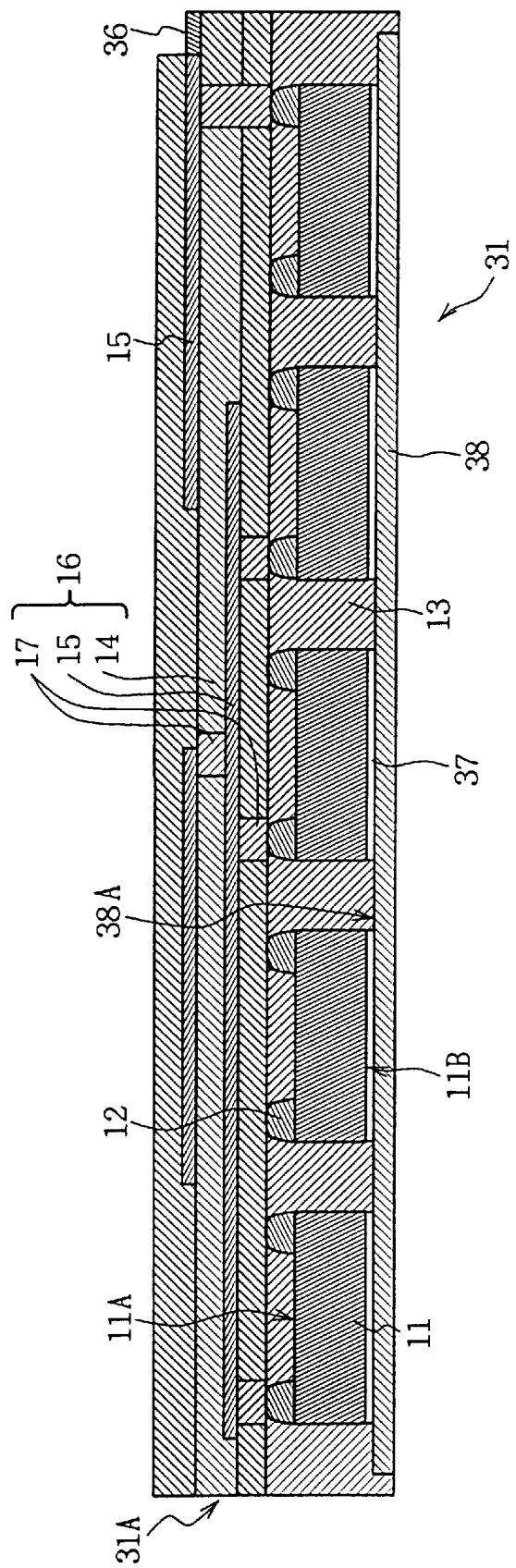
FIG. 8 is a schematic sectional view showing the construction of a first multichip module according to the second embodiment.

As shown in FIG. 8 in which parts corresponding to those in FIG. 2 are designated by the same reference numerals, in the first multichip module 31, a plurality of chip parts 11 are integrally sealed by a molding material 13 while back surfaces 11B opposed to circuit surfaces 11A bonded to one surface 38A of a base substrate 38 made of a prescribed metal through an adhesive agent 37. The end parts of prescribed conductor patterns of a wiring part 16 are exposed in a peripheral side surface 31A opposed to the one end on which the external terminals 36 are provided.

Figure 9:
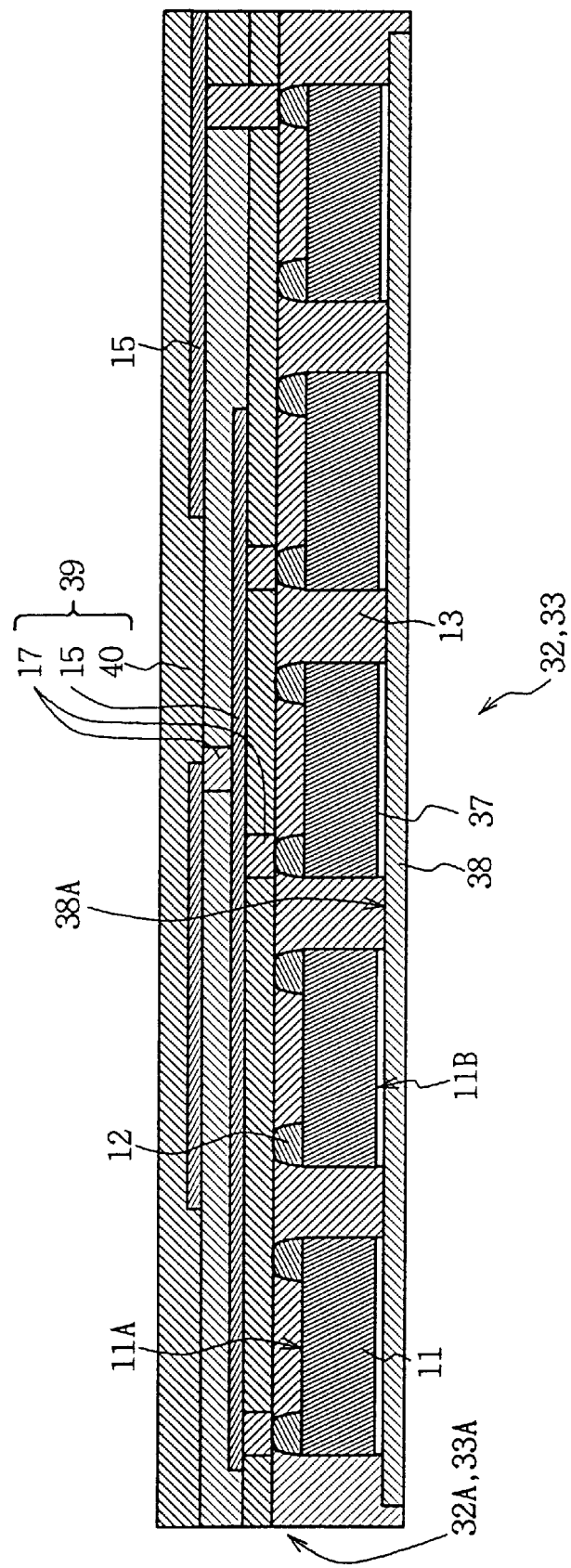
FIG. 9 is a schematic sectional view showing the construction of a second multichip module according to the second embodiment.

As illustrated in FIG. 9 in which parts corresponding to those in FIG. 2 are designated by the same reference numerals, in multichip modules located below the first multichip module 31 (these are called second multichip modules, hereinafter) 32 and 33, an insulating layer 40 located in the uppermost layer of a wiring part 39 is formed so as to cover the entire surface of a wiring layer 15 located just below the insulating layer 40 and the end parts of the prescribed conductor patterns of the wiring part 39 are exposed to peripheral side surfaces 32 and 33A. In addition thereto, in the second multichip modules 32 and 33, respective chip parts 11 are integrally sealed by a molding material 13 while respective back surfaces 11B are bonded to the one surface 38A of a base substrate 38 through an adhesive agent 37.

Figure 10:
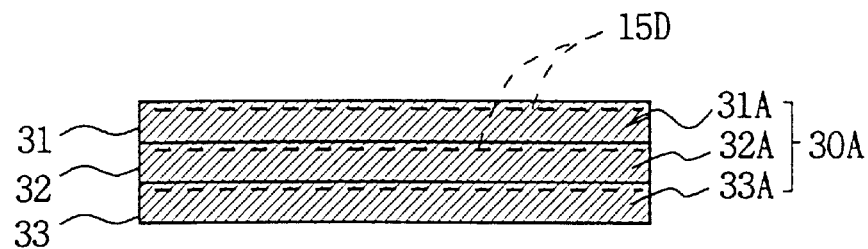
FIG. 10 is a schematic view for explaining the peripheral side surface of the multilayer multichip module.

Further, as shown in FIG. 10, in the multilayer chip module 30, the first and second multichip modules 31 to 33 are piled and formed so that the peripheral side surfaces 31A to 33A (peripheral side surface 30A) to which the end parts of the conductor patterns 15D are exposed are directed to the same direction.

Figure 11:
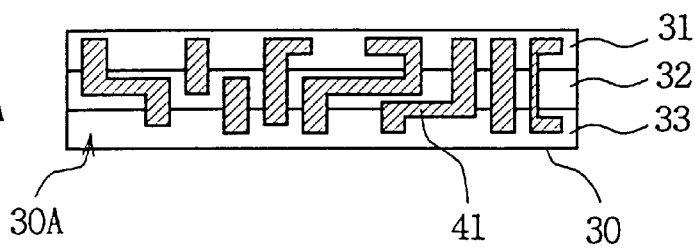
FIGS. 11A and 11B are schematic views for explaining the peripheral side surface in which the first and second multichip modules are electrically connected together.
Figure 11:
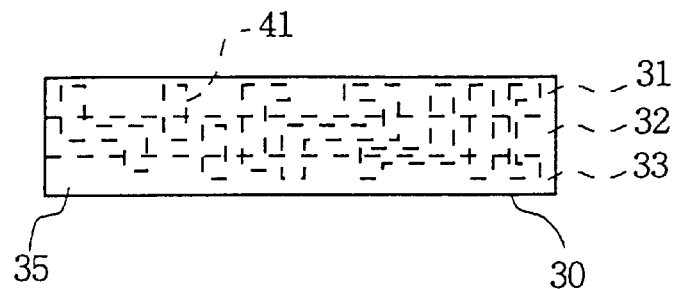

As illustrated in FIGS. 11A and 11B, wiring lines 41 are formed in prescribed patterns so as to electrically conductively connecting together the end parts of the corresponding conductor patterns (FIG. 11A) and the protective film 35 for the wiring lines 41 is formed (FIG. 11B).

Thus, in the multilayer multichip module 30, for instance, when the respective external terminals 36 are electrically connected to the respectively corresponding electrodes of a mother board (not illustrated) and loaded, the respective electrodes of the mother board are relatively separated from the wiring lines 41 on the peripheral side surface 30A, and therefore, a short-circuit can be prevented from occurring between the respective electrodes of them other board and the wiring lines 41.

(2-2) Procedure for manufacturing multilayer multichip module according to the second embodiment The multilayer multichip module 30 can be actually manufactured in accordance with the following procedure illustrated in FIGS. 12A to 14B in which parts corresponding to those in FIGS. 3A to 3D, 4A and 4B are denoted by the same reference numerals.

Figure 12A:
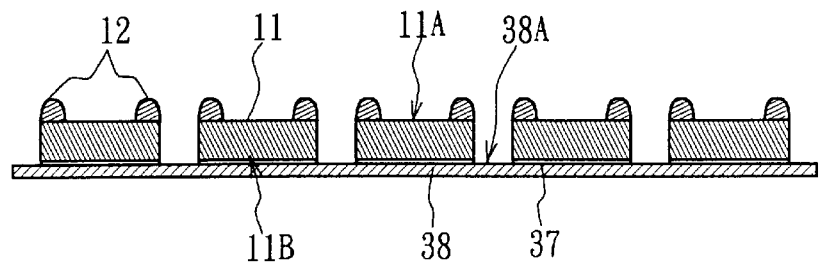
FIGS. 12A to 12D are schematic sectional views showing a procedure for manufacturing the first and second multichip modules.
Figure 12B:
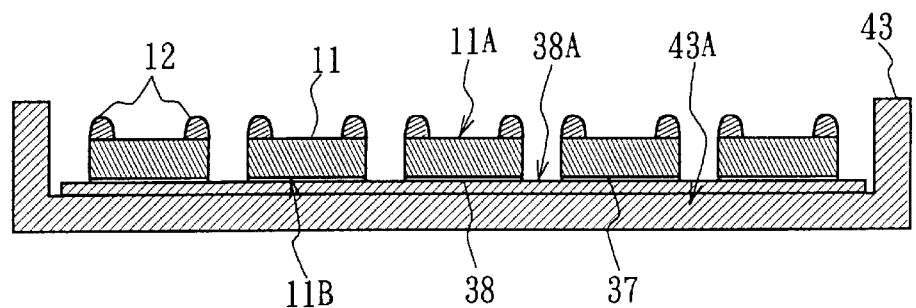

Initially, as shown in FIG. 12A, a plurality of chip parts 11A are arranged in prescribed conditions while the back surfaces 11B are bonded to the one surface 38A of the base substrate 38 through the adhesive agent 37. Then, as shown in FIG. 12B, the base substrate 38 is arranged and positioned on the bottom part 43A of a mold die 43 so as to direct the circuit surfaces 11A of the chip parts 11.

Figure 12C:
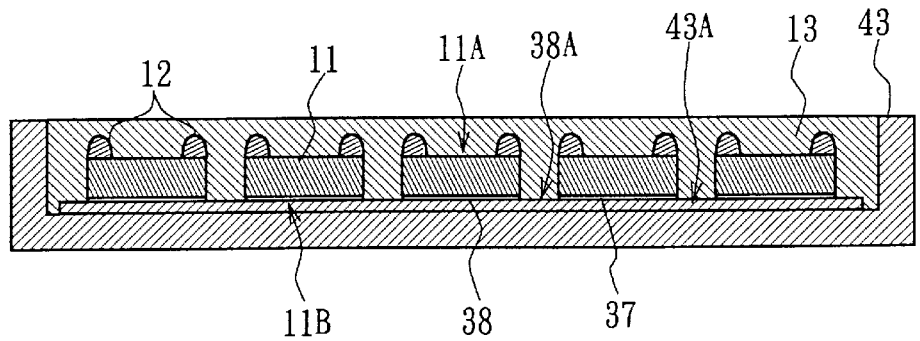

Subsequently, as illustrated in FIG. 12C, the mold die 43 is filled with the molding material 13 by using a prescribed device (not shown), and then, the filled molding material 13 is heated by using a heating furnace (not illustrated) or the like and hardened.

Figure 12D:
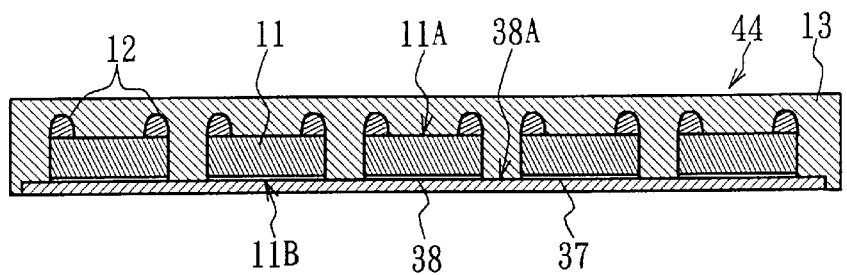
Figure 13A:
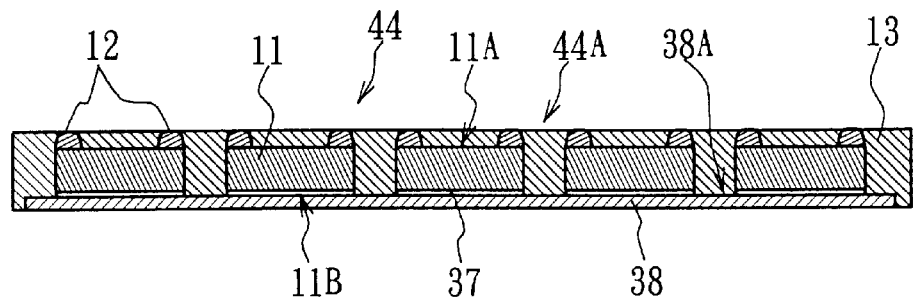
FIGS. 13A to 13C are schematic sectional views showing the manufacturing procedure of the first and second multichip modules.

Then, as shown in FIG. 12D, a mold sheet 44 is taken out from the mold die 43, and then, as shown in FIG. 13A, the upper surface of the mold sheet 44 is polished by employing a prescribed polishing machine (not illustrated) so that the upper parts of respective gold bumps 12 are exposed.

Figure 13B:
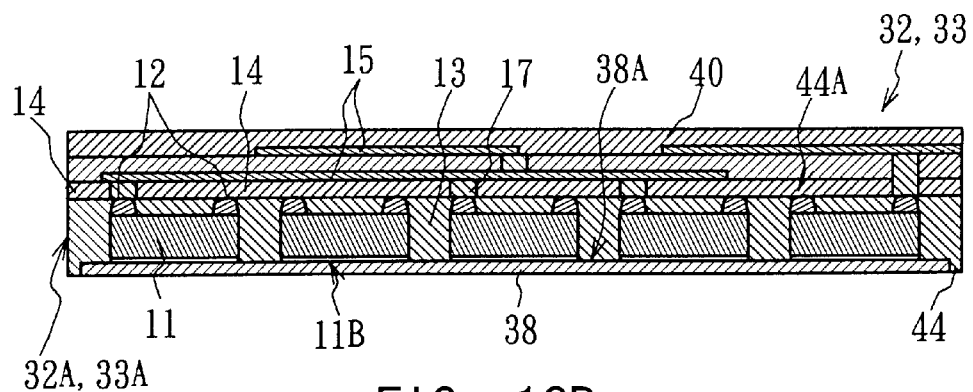

Subsequently, as illustrated in FIG. 13B, the polished surface 44A of the mold sheet 44 is coated with a polyimide resin in accordance with a spin coating method or the like and the polyimide resin coated surface 44A is subjected to a patterning treatment under a photoprocessing method or the like so that an insulating layer 14 is formed. Then, copper is sputtered on the insulating layer 14 by using a prescribed sputtering device (not illustrated). The obtained copper foil is subjected to a patterning treatment under a photoprocessing method or the like so that a wiring layer 15 is formed on the insulating layer 14. After that, the insulating layers 14 and the wiring layers 15 are sequentially and alternately laminated and formed on the wiring layer 15 in a similar manner so that the insulating layer 40 is located at an uppermost layer.

In this way, the second multichip modules 32 and 33 having the end parts of conductor patterns exposed in prescribed peripheral side surfaces 32A and 33A can be manufactured.

Figure 13C:
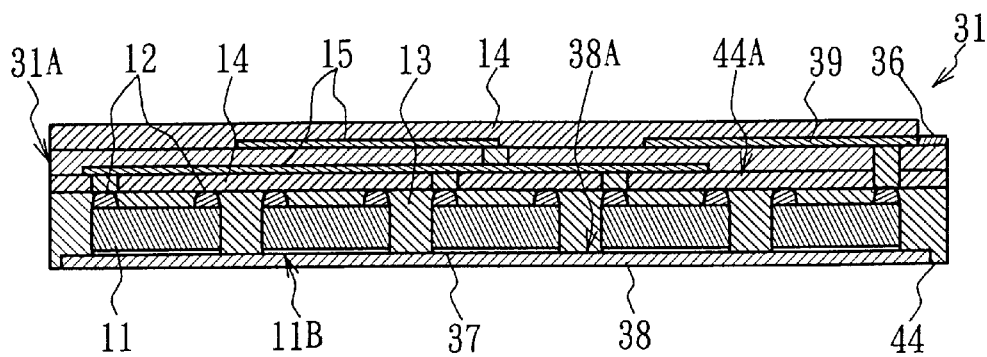

Further, as illustrated in FIG. 13C, an end in the side opposed to the peripheral side surface 31A in the insulating layer 40 located in the uppermost layer of the wiring part 39 according to the photoprocessing method or the like is peeled off to thereby expose the respective external terminals 36 in the wiring part 39. Thus, the first multichip module 31 can be manufactured.

Figure 14A:
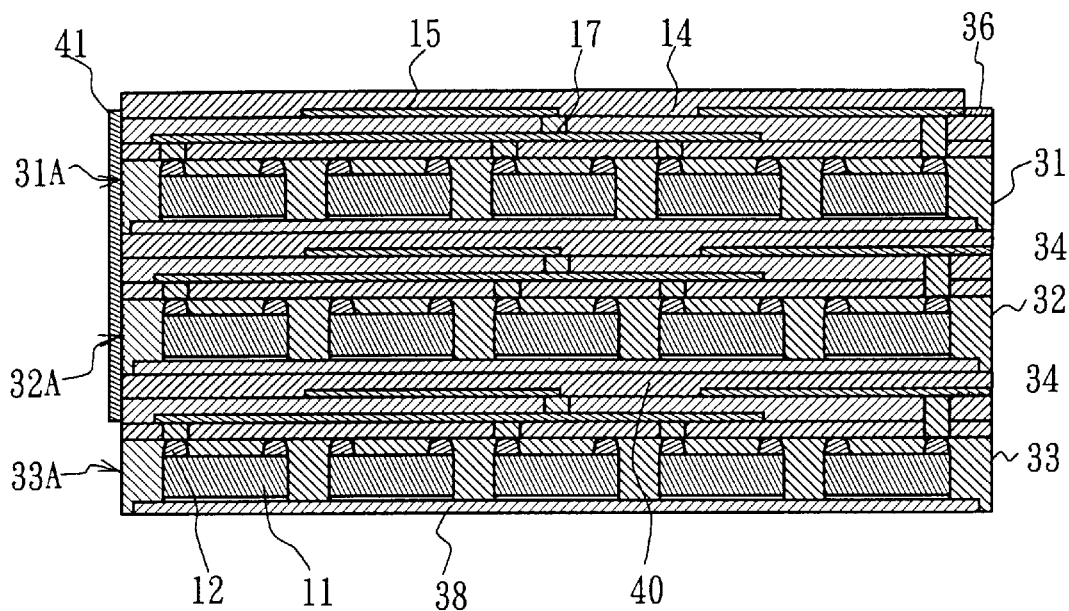
FIGS. 14A and 14B are schematic sectional views showing the manufacturing procedure of the multilayer multichip module.

Then, as shown in FIG. 14A, the first multichip module 31 is located at the uppermost layer, the peripheral side surfaces 31A to 33A are directed to the same direction and the first and second multichip modules 31 to 33 are sequentially laminated and formed through the adhesive agent 34 in the direction of thickness. Then, copper is sputtered on the peripheral side surfaces 31A to 33A by employing a prescribed sputter device (not shown). The obtained copper foil is subjected to the patterning treatment according to the photoprocessing method or the like to thereby form the wiring lines 41. Thus, the corresponding end parts of the conductor patterns are electrically conductively connected together through the wiring lines 41.

Figure 14B:
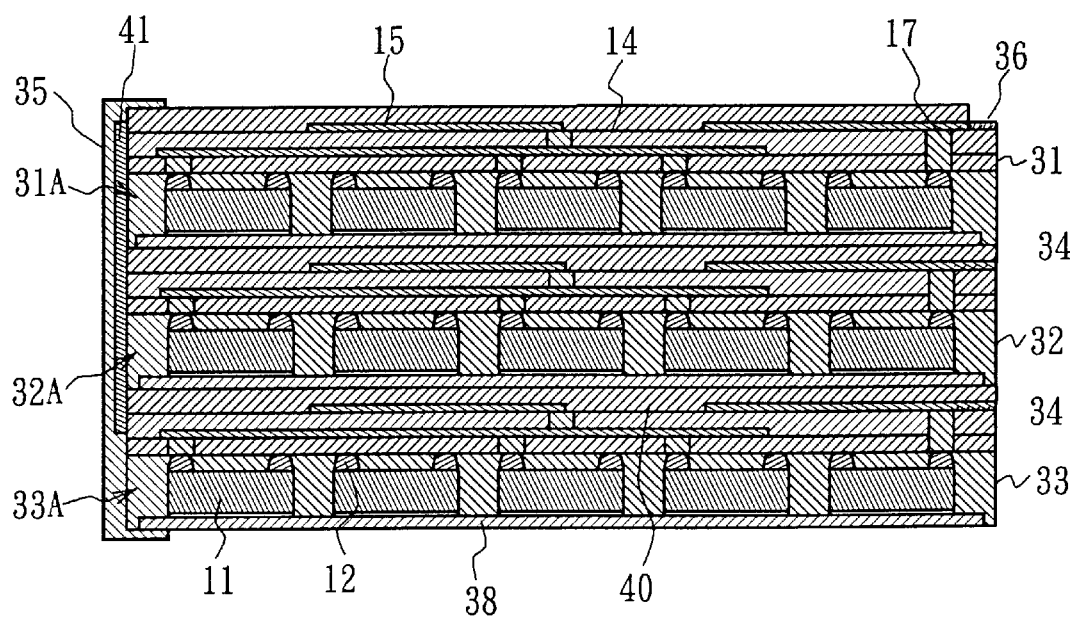

Subsequently, as illustrated in FIG. 14B, the protective film 35 is formed on the peripheral side surfaces 31A to 33A on which the wiring lines 41 are formed in accordance with a screen printing method and so on. Thus, the multilayer multichip module 30 in which the first and second multichip modules 31 to 33 are laminated and formed can be manufactured.

(2-3) Operation and effects according to the second embodiment

According to the above mentioned construction, while the chip parts 11 are 25 arranged in prescribed conditions on the one surface 38A of the base substrate 38, they are arranged on the bottom part 43A of the mold die 43 and integrally sealed by the molding material 13 (FIGS. 12A to 12C). Then, the upper surface of the thus obtained mold sheet 44 is polished to expose the gold bumps 12. The wiring part 16 or 39 is formed on the polished surface 44A of the mold sheet 44, so that the first and second multichip modules 32 and 33 are produced (FIGS. 13A to 13C).

Then, the first and second multichip modules 31 are, while the peripheral side surfaces 31A to 33A are directed to the same direction, sequentially laminated and formed through the adhesive agent 34 so as to locate the first multichip module 31 at the uppermost layer. After that, the wiring lines 41 and the protective film 35 are sequentially formed on the peripheral side surfaces 31A to 33A. Thus, the first and second multichip modules 31 to 33 are electrically connected together so that the multilayer multichip module 30 is manufactured (FIGS. 14A to 14B).

Therefore, according to the above mentioned manufacturing procedure, the first and second multichip modules 31 to 33 with a size substantially equal to that of the multichip module 10 (FIG. 2) according to the above described first embodiment are manufactured. The multilayer multichip module 30 can be produced from the thus manufactured first and second multichip modules 31 to 33. Further, according to the manufacturing procedure, the first and second multichip modules 31 to 33 are electrically connected together through the wiring lines 41 formed on the peripheral side surface 30A of the multilayer multichip module 30, so that the multilayer multichip module 30 can be formed so that its size is substantially equal to that obtained only by laminating the first and second multichip modules 31 to 33.

Specifically stated, when the first and second multichip modules 31 to 33 can be electrically connected together by comparatively short wiring lines 41, a high speed characteristic and a high frequency characteristic can be prevented from being lowered during the operation of the formed multilayer multichip module 30.

In the multilayer multichip module 30 manufactured according to such a manufacturing procedure, as the base substrates 38 are respectively provided on the back surfaces of the first and second multichip modules 31 to 33, the generation of crosstalk noise between the first and second multichip modules 31 to 33 can be prevented by the base substrates 38 during the operation of the multilayer multichip module 30. Further, the second multichip module 33 located at a lowermost layer can radiate heat generated inside through the base substrate 38. Accordingly, in the multilayer multichip module 30, a relatively high quality is maintained and a comparatively high reliability can be obtained even during its operation.

Further, in the multilayer multichip module 30, since the external terminals 36 are relatively separated from the wiring lines 41 through which the first and second multichip modules 31 to 33 are electrically connected together, the short circuit between the external terminals 36 and the wiring lines 41 is prevented from occurring, when the multilayer multichip module is connected through the external terminals 36 to, for example, the mother board.

According to the above stated formation, the respective chip parts 11 having the gold bumps 12 provided on the pads are integrally sealed by the molding material 13 while the respective circuit surfaces 11A are directed to the same direction and arranged in prescribed conditions, and the insulating layers 14 and 40 and the wiring layers 15 electrically conductively connected to the gold bumps 12 are sequentially and alternately piled and formed on the mold sheet material 13 so that the first and second multichip modules 31 to 33 are manufactured. After that, the first and second multichip modules 31 to 33 are sequentially laminated and formed in the direction of thickness and the wiring lines 41 are provided on the peripheral side surface 30A. Thus, the multilayer multichip module 30 having a size substantially the same as that got only by laminating the first and second multichip modules 31 to 33 can be manufactured. Thus, electronic devices which can be made easily compact and a method for manufacturing electronic devices can be achieved.

Figure 15:
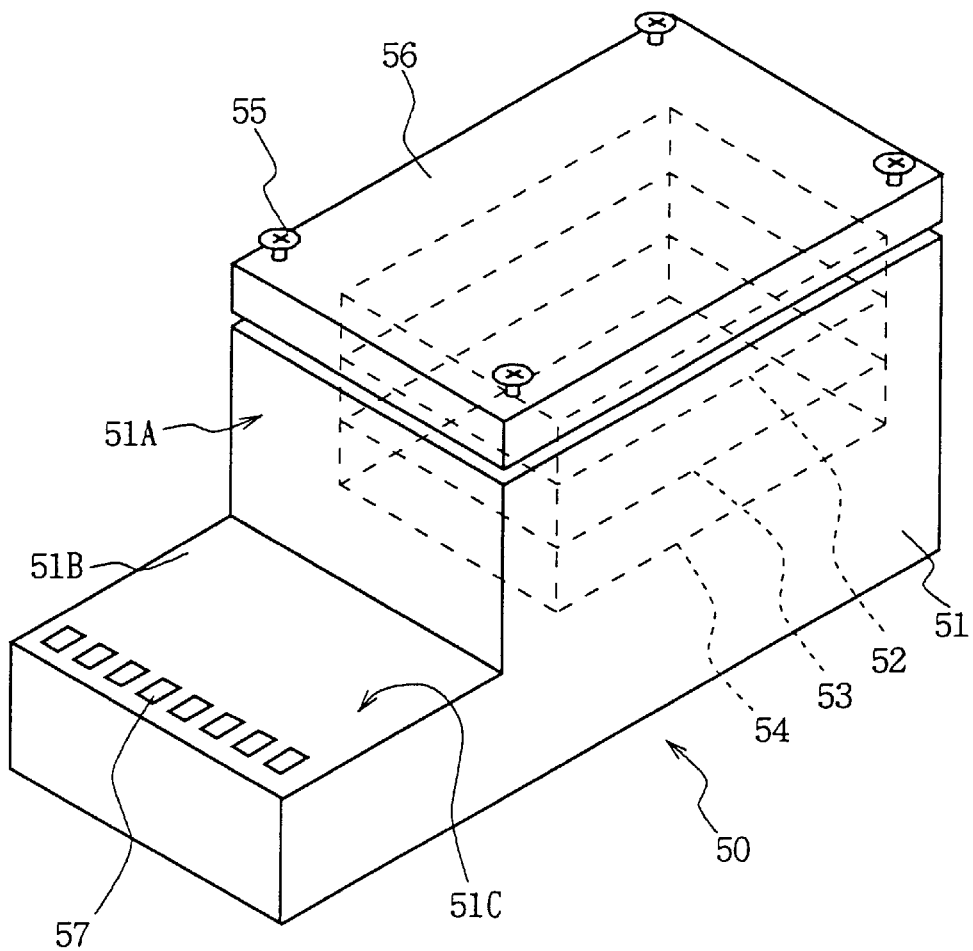
FIG. 15 is a schematic perspective view illustrating the construction of a multilayer multichip module according to a third embodiment.

(3) Third Embodiment (3-1) Construction of multilayer multichip module according to a third embodiment FIG. 15 illustrates a multilayer multichip module 50 according to a third embodiment. Referring to the figure, a plurality of multichip modules 52 to 54 are laminated and arranged in the direction of thickness in a box shaped ceramic cavity 51, and pressed and housed therein under a prescribed pressure by a cover part 56 made of a plate attached onto the cavity by means of screws 55. A plurality of external terminals 57 are provided on the one surface 51C of a plate part 51B provided so as to protrude on the lower end part of the peripheral side surface 51A of the ceramic cavity 51.

Figure 16:
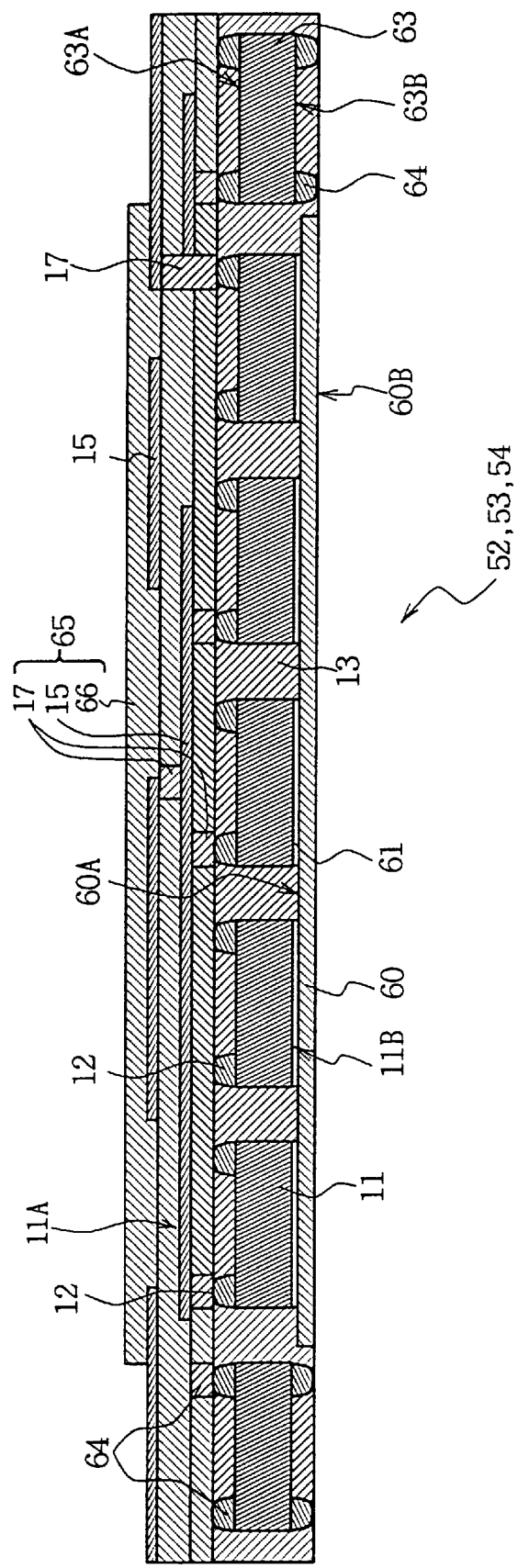
FIG. 16 is a schematic sectional view showing the construction of a multichip module according to the third embodiment.

In this case, as illustrated in FIG. 16 in which parts corresponding to those in FIG. 2 are designated by the same reference numerals, in the multichip modules 52 to 54, while the back surfaces 11B of a plurality of chip parts 11 are arranged and connected to the one surface 60A of a base substrate 60 through an adhesive agent 61 in prescribed conditions and chip for through hole 63 respectively having one surface 63A and a back surface 63B which are provided with gold bumps 64 are arranged in prescribed states in the periphery of the chip parts 11, the chip parts 11 and the chip for through hole 63 are sealed in one end by a molding material 13 so as to expose the end parts of the gold bumps 64 on the back surface 60B of the base substrate 60 and the back surfaces 63B of the chip for through hole 63.

Further, in the multichip modules 52 to 54, parts corresponding to the positions where the chip for through hole 63 are disposed are peeled off in an insulating layer 66 located in the uppermost layer of a wiring part 65. The end parts of the prescribed conductor patterns of wiring layers 15 are exposed as terminals 68. The exposed terminals 68 are electrically conductively connected to the gold bumps 64 on the surfaces 63A of the corresponding chip for through hole 63 sequentially through the conductor patterns of the wiring layers 15 and bearing parts 17.

Figure 17:
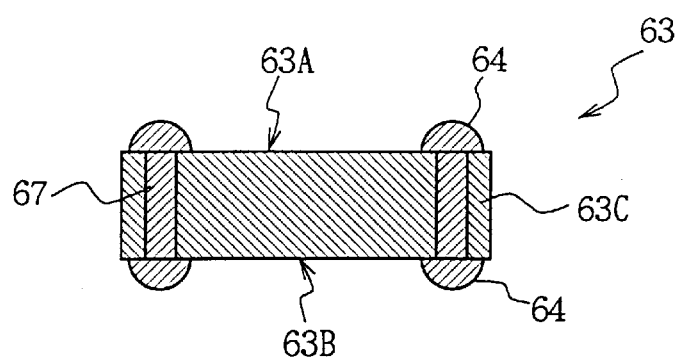
FIG. 17 is a schematic sectional view illustrating the construction of a chip for through hole.

In this connection, as illustrated in FIG. 17, in the chip for through hole 63, the gold bumps 64 formed on one surface 63A are electrically conductively connected to the corresponding gold bumps 64 formed on the back surface 63B through bearing parts 67 formed in a base material 63C formed with an insulating substrate or the like.

Figure 18:
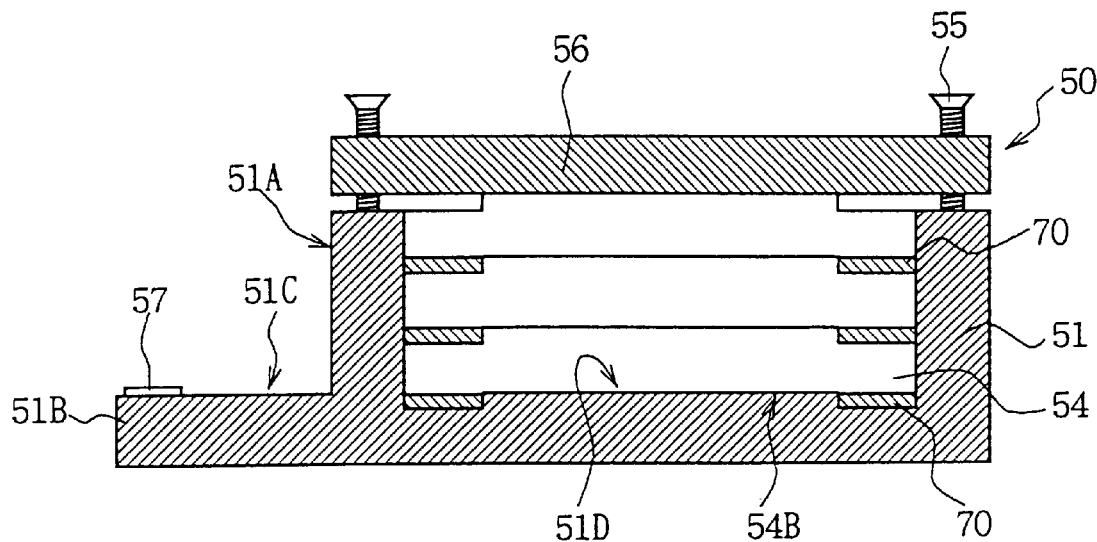
FIG. 18 is a schematic sectional view showing a construction in the multilayer multichip module.

Accordingly, as shown in FIG. 18, in the multilayer multichip module 50, signal inputting and outputting terminals (not shown) which are opposed to the gold bumps 64 exposed on the back surface 54B of the multichip module 54 and electrically conductively connected to the external terminals 57 are provided on a bottom surface 51D in the ceramic cavity 51. For example, anisotropic conductive sheets 70 formed by burying a plurality of electrically conductive metallic fine lines in a rubber sheet with high density are held in positions between the bottom surface 51D and, one end side and the other end side of the back surface 54B of the multichip module 54. The anisotropic conductive sheets 70 are also held in one end sides and the other end sides of the respective multichip modules 52 to 54. Then, the respective multichip modules 52 to 54 are pressed under such a state, so that the terminals 68 can be electrically connected to the gold bumps 64 corresponding thereto through the anisotropic conductive sheets 70. Parenthetically, pressure applied to the respective multichip modules 52 to 54 can be adjusted depending on the quantity of fastening of the screws 55 for attaching the cover part 56 onto the ceramic cavity 51.

(3-2) Procedure for manufacturing multilayer multichip module according to the third embodiment The multilayer multichip module 50 can be actually manufactured according to the following procedure shown in FIGS. 19A to 22B in which parts corresponding to those in FIGS. 3A to 3D, 5A and 5B are indicated by the same reference numerals.

Figure 20:
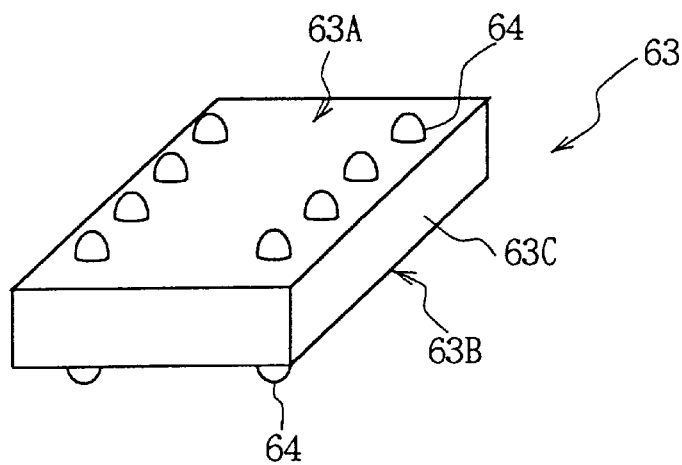
FIG. 20 is a schematic perspective view for explaining the chip for through hole.
Figure 19A:
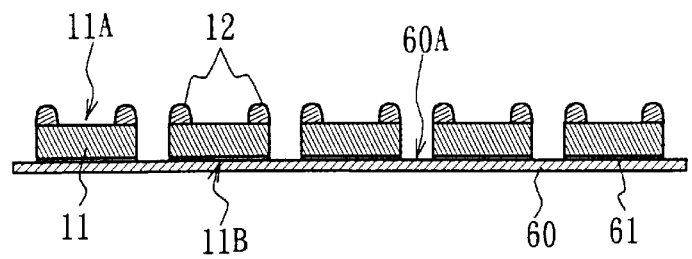
FIGS. 19A to 19C are schematic sectional views showing the manufacturing procedure of the multichip module.

Namely, as first shown in FIG. 19A, the respective chip parts 11 are arranged in prescribed conditions by bonding their back surfaces 11B to the one surface 60A of the base substrate 60 through the adhesive agent 61. As shown in FIG. 20, at this time, the one surface 63A of the base material 63C composed of the insulating material is subjected to a patterning treatment according to a photoprocessing method or the like so that through holes are bored at prescribed intervals. Bearing parts are formed in such a manner as to fill the bored through holes with an electrically conductive metal. Then, the gold bumps 64 are formed at the end parts of the bearing parts exposed on the one surface 63A and the back surface 63B of the base material 63C. Thus, the chip for through hole 63 is formed.

Figure 19B:
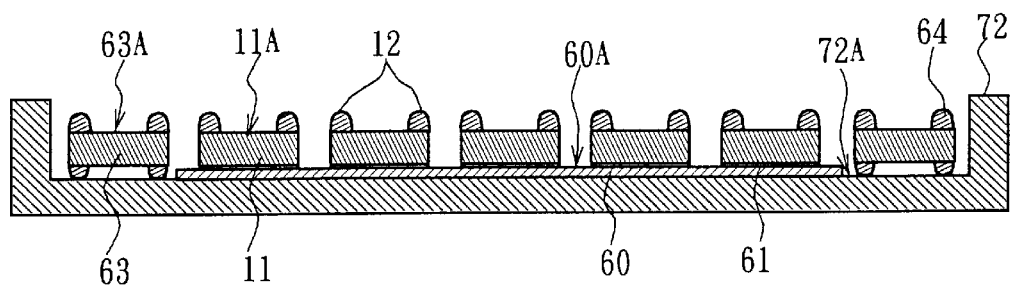

Subsequently, as illustrated in FIG. 19B, the base substrate 60 is arranged and positioned on the bottom part 72A of a mold die 72 so that the circuit surfaces 11A of the chip parts 11 are directed upward. Further, the chip for through hole parts 63 are arranged and positioned on the periphery of the base substrate 60 so that the surfaces 63A are directed upward.

Figure 19C:
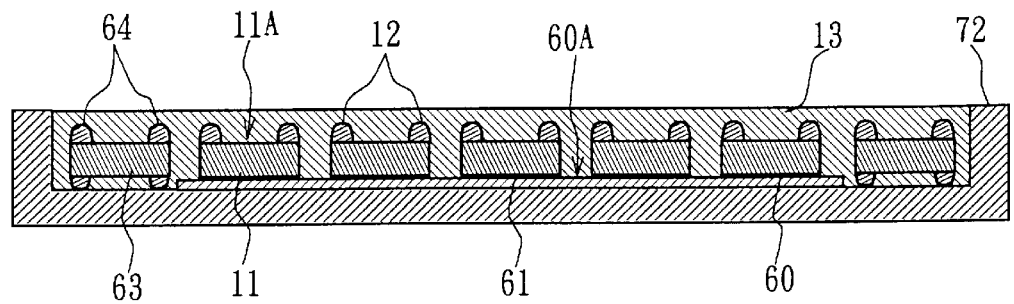
Figure 21A:
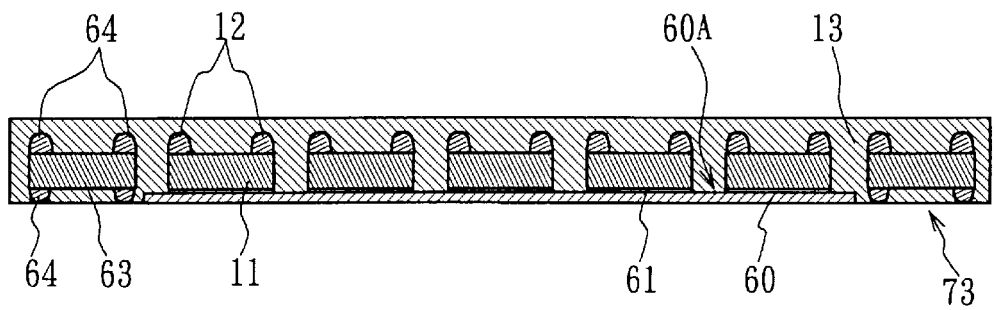
FIGS. 21A to 21C are schematic sectional views showing a procedure for manufacturing the multichip module.
Figure 21B:
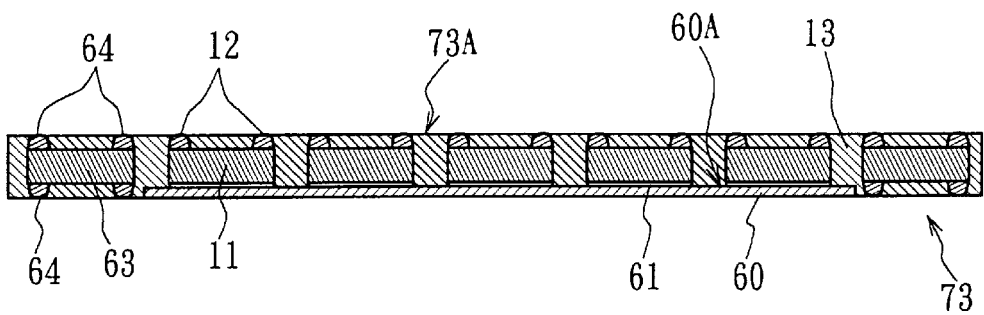
Figure 21C:
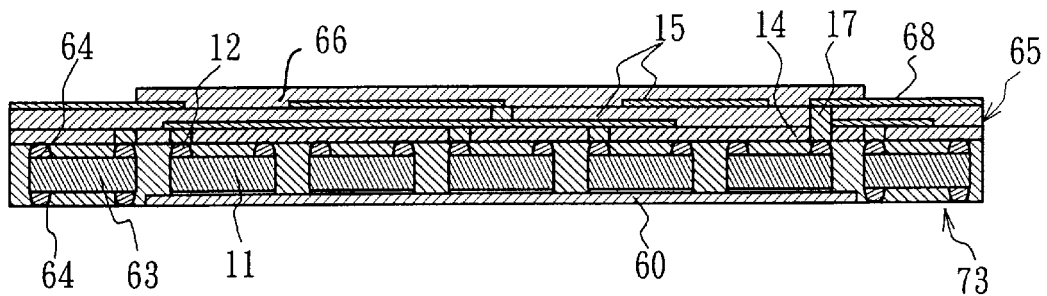
Figure 22:
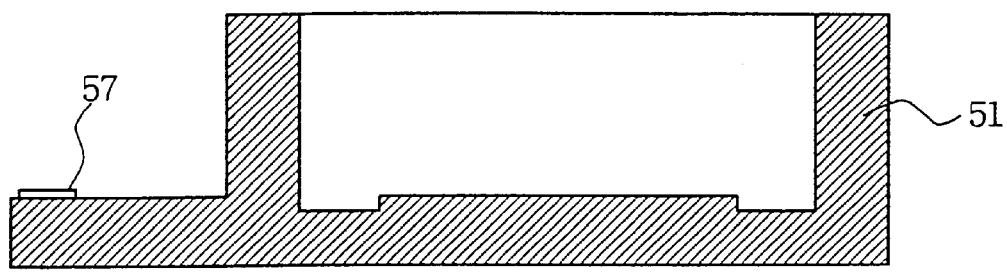
FIGS. 22A and 22B are schematic sectional views for explaining the production of a cavity and the multilayer multichip module.
Figure 22:
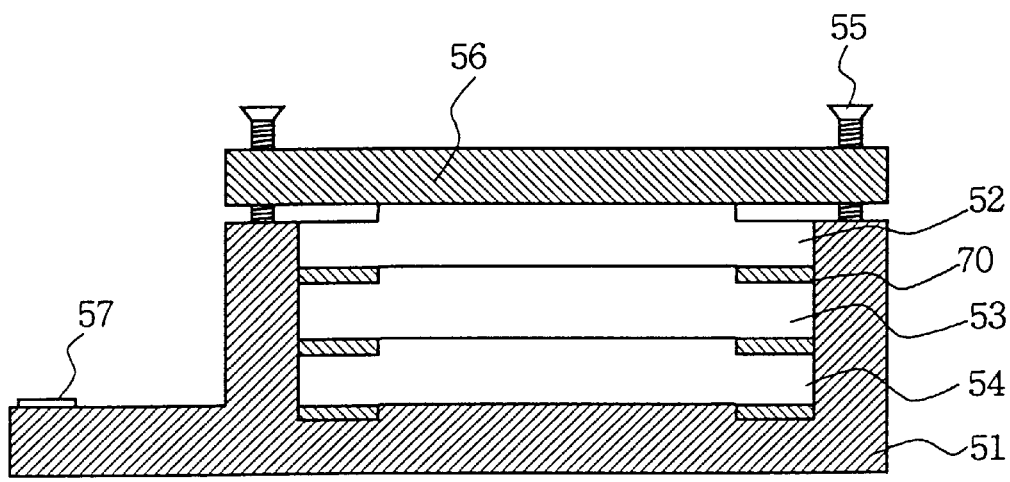

Then, as shown in FIG. 19C, the mold die 72 is filled with a molding material 13 by using a prescribed molding device (not illustrated) and then, the filled molding material 13 is heated and hardened by a heating furnace (not illustrated) or the like.

Then, as illustrated in FIG. 20A, a mold sheet 73 is taken out from the mold die 72. After that, as shown in FIG. 20B, the upper surface of the mold sheet 73 is polished by a prescribed polishing machine (not shown) so that the upper parts of the gold bumps 12 and 64 are exposed.

Subsequently, as seen in FIG. 20C, the polished surface 73A of the mold sheet 73 is coated with a polyimide resin by the spin coating method or the like and an insulating layer 14 is formed by the photoprocessing method or the like. Then, copper is sputtered on the insulating layer 14 by employing a prescribed sputtering device (not shown) and the obtained copper foil is subjected to a patterning treatment under the photoprocessing method or the like so that a wiring layer 15 is formed on the insulating layer 14. Then, the insulating layers 14 and the wiring layers 15 are sequentially and alternately laminated and formed on the wiring layer 15 in a manner similar to the above described operations so that the insulating layer 14 is located at an uppermost layer. The insulating layer 14 formed on the uppermost layer undergoes a patterning treatment according to the photoprocessing method or the like so that a plurality of terminals 68 are exposed. In this manner, the multichip modules 52 to 54 can be manufactured.

As illustrated in FIG. 22A, the ceramic cavity 51 is formed according to a green sheet method or the like. Then, as illustrated in FIG. 22B, the respective multichip modules 52 to 54 are sequentially piled and arranged in the direction of their thickness through the anisotropic conductive sheets 70 and housed in the formed ceramic cavity 51. Thereafter, the cover part 56 is fixed onto the ceramic cavity 51 by means of the screws 55 so that the respective multichip modules 52 to 54 are pressed under a prescribed pressure. Thus, the multilayer multichip module 50 can be produced.

(3-3) Operation and effects according to the third embodiment

According to the above mentioned construction, in the multilayer multichip module 50, the respective chip parts having the gold bumps 12 formed on respective pads are arranged in prescribed conditions while the back surfaces 111B are connected to the one surface 60A of the base substrate 60 (FIG. 19A). Then, the base substrate 60 on which the chip parts 11 are disposed and the chip for through hole 63 are arranged and positioned on the bottom part 72A of the mold die 72 and integrally sealed by the molding material 13 (FIGS. 19A to 19C).

Then, the upper surface of the mold sheet 73 formed in this manner is polished to expose the gold bumps 12 and 64. After that, the wiring part 65 is formed on the polished surface 73A obtained by polishing, so that the respective multichip modules 52 to 54 are manufactured (FIGS. 20A to 20B). Subsequently, the respective multichip modules 52 to 54 are housed in the ceramic cavity 51 while they are sequentially laminated and disposed in the direction of their thickness through the anisotropic conductive sheets 70 and the cover part 56 is fixed onto the ceramic cavity 51 so that the multilayer multichip module 50 is formed (FIGS. 22A and 22B).

Therefore, according to the above mentioned manufacturing procedure, the multichip modules 52 to 54 in which the terminals are exposed on the wiring parts 65 and the chip for through hole 63 are provided are successively piled and arranged through the anisotropic conductive sheets 70 and housed in the ceramic cavity 51. Thus, the multichip modules 52 to 54 can be easily electrically connected together. Further, the multilayer multichip module 50 can be manufactured in a size comparatively near to a size got only by laminating and arranging the respective multichip modules 52 to 55.

Further, in the multilayer multichip module 50 produced and obtained according to such a manufacturing procedure, the respective multichip modules 52 to 54 can be mechanically protected from outside by means of the ceramic cavity 51.

According to the above described formation, since the chip parts 11 having the gold bumps 12 formed on the pads and the chip for through hole 63 are arranged in prescribed conditions while the circuit surfaces 11A and the surfaces 63A are directed to the same direction, and integrally sealed by the molding material 13 so as to expose the upper end parts of the gold bumps 12 and 64, the insulating layers 66 and the wiring layers 15 are sequentially and alternately laminated and formed on a plurality of molding materials 13 for sealing the respective chip parts 11 so as to have the desired number of layers in the direction of their thickness so that the multichip modules 52 to 54 are formed, and the multichip modules 52 to 54 are housed in the ceramic cavity 51 by sequentially laminating and arranging the respective multichip modules 52 to 54 through the anisotropic conductive sheets 70, the multichip modules 52 to 54 can be easily conductively connected together only by laminating and arranging the multichip modules 52 to 54. In addition, the multilayer multichip module 50 of a size comparatively near to the size obtained only by laminating and arranging the multichip modules 52 to 54 can be manufactured. Thus, electronic parts which 33 can be readily made compact and a method for manufacturing electronic parts can be realized.

(4) Other Embodiments

Figure 23:
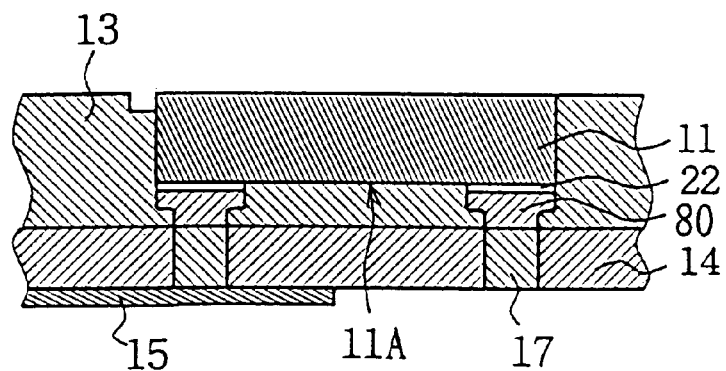
FIG. 23 is a schematic sectional view showing protrusion electrodes respectively formed on the pads of chip parts according to other embodiment.
Figure 25:
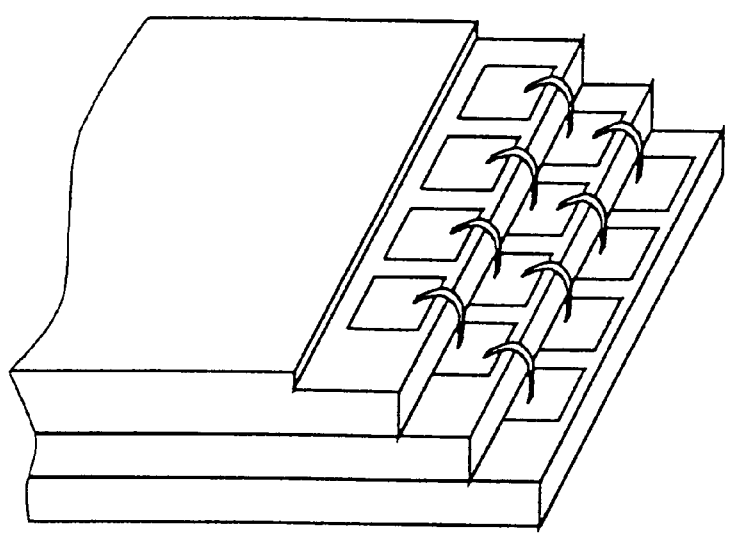
FIG. 25 is a schematic perspective view for explaining the external terminals of a multilayer multichip module according to other embodiment.

Although, in the above described first to third embodiments, the examples in which the gold bumps 12 are respectively formed on the pads provided on the circuit surfaces 11A of the chip parts 11 have been described, it is to be recognized that the present invention is not limited thereto, and, for example, protrusion electrodes 80 made of copper or solder may be provided on pads 22 in place of the gold bumps 12, as shown in FIG. 23 in which parts corresponding to those in FIG. 6 are designated by the same reference numerals.

Further, although, in the first embodiment, the example in which the present invention is applied to the multichip module 10 comprising one layer has been described, it is to be noted that the present invention is not limited thereto and may be applied to a multilayer multichip module comprising a plurality of multichip modules 10.

Figure 24:
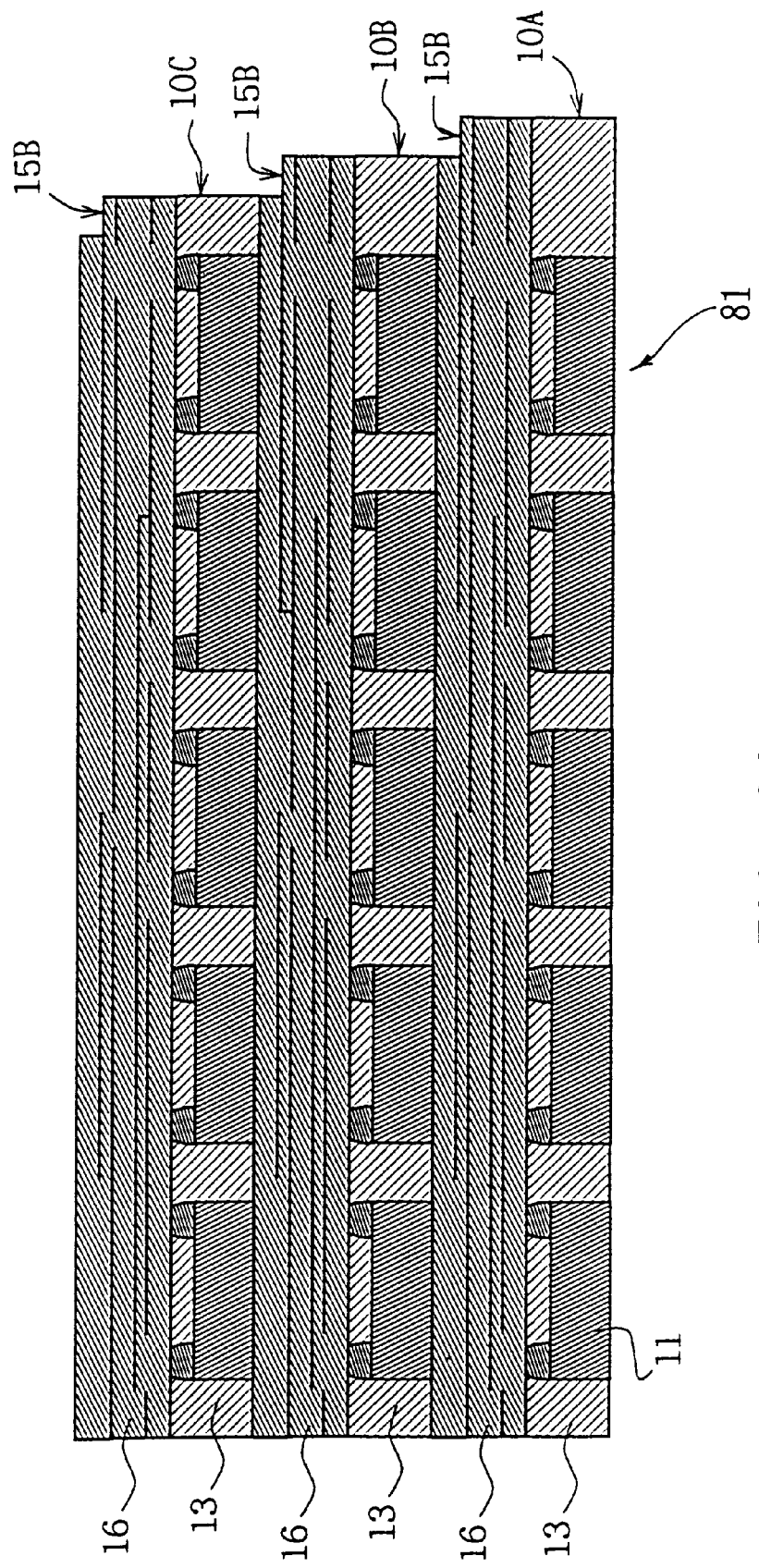
FIG. 24 is a schematic sectional view showing the construction of a multichip module according to other embodiment.

In this case, for example, as illustrated in FIG. 24 in which parts corresponding to those in FIG. 2 are indicated by the same reference numerals, in a multilayer multichip module 81, multichip modules 10A to 10C formed with respectively slightly different sizes are sequentially laminated and arranged through an adhesive agent such as an epoxy resin so that one end side in which external terminals 15B are provided is formed in the shape of a staircase and the external terminals 15B are exposed. In addition thereto, as shown in FIG. 24, the respectively corresponding external terminals 15B of the multichip modules 10A to 10C may be electrically conductively connected together by, for example, a wire bonding method. Thus, a plurality of multichip modules 10A to 10C can be stacked and arranged without difficulty.

Still further, although, in the above described second embodiment, the example in which the wiring lines 41 are formed on the peripheral side surface 30A of the multilayer multichip module 30 according to the sputtering or photo-processing method has been described, it is to be noticed that the present invention is not limited thereto, and the wiring lines 41 may be formed by, for instance, sputtering an electrically conductive metal on the peripheral side surface 30A and then performing a laser cutting method and so on.

Still further, although, in the above mentioned first to third embodiments, the examples in which the respective chip parts 11 are arranged on the bottom parts 20A, 43A and 72A of the mold dies 20, 43 and 72 which are filled with the molding material 13 have been described, it is to be noted that the present invention is not limited thereto, and the chip parts 11 may be integrally sealed by a transfer molding method.

In addition, although, in the above described first to third embodiments, the examples in which the insulating layers 14 are formed on the polished surfaces 21A, 44A and 73A of the mold sheets 21, 44 and 73 and the wiring layers 15 according to the spin coating method have been described, it is to be understood that the present invention is not limited thereto, and the insulating layers 14 may be formed on the polished surfaces 21A, 44A and 73A of the mold sheets 21, 44 and 73 and the wiring layers 15 according to a printing method or the like.

Additionally, although, in the above described first to third embodiments, the examples in which the conductor patterns of the wiring layers 15 are made of the copper foil have been described, it is to be recognized that the present invention is not limited thereto, and the conductor patterns may be formed with various kinds of other electrically conductive metal foil such as aluminum foil.

Additionally, although, in the first to third embodiments, the forms in which the molding material 13 composed of the epoxy resin is employed as the insulating material for integrally sealing the chip parts 11 arranged in prescribed conditions with their circuit surfaces directed to the same direction so as to cover the circuit surfaces 11A and expose the protrusion electrodes 12 have been described, it is to be noted that the present invention is not limited thereto, and various kinds of other insulating materials such as other resin materials may be employed by which the chip parts 11 arranged in prescribed conditions with the circuit surfaces 11A directed to the same direction can be sealed integrally so as to cover the circuit surfaces 11A and expose respectively the protrusion electrodes 12.

Still additionally, although, in the above mentioned first to third embodiments, the examples in which the bearing parts 17 obtained by forming the copper foil on the inner peripheral surfaces of the through holes 17A are employed as the electrically conductively connecting means for electrically conductively connecting together the protrusion electrodes, the wiring layers respectively corresponding thereto and spaces between the wiring layers respectively corresponding thereto have been described, the present invention is not limited thereto, and various electrically conductively connecting means such as bearing parts obtained by forming aluminum foil on the inner peripheral surfaces of the through holes 17A or conductive materials such as silver with which the through holes 17A are filled may be utilized.

Figure 26:
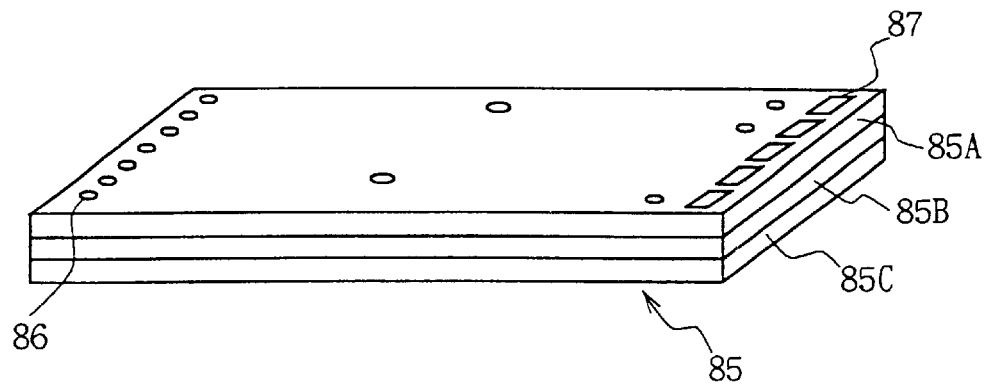
FIGS. 26A and 26B are schematic views showing the construction of a multilayer 42 multichip module according to other embodiment.
Figure 26:
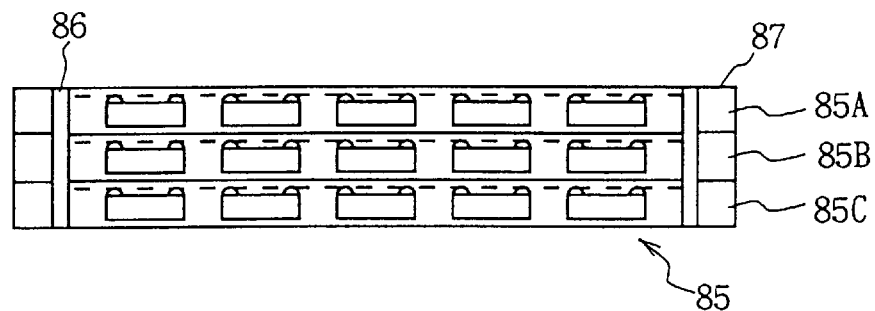

Furthermore, although, in the first to third embodiments, the examples in which the mechanically connecting adhesive agent 34, the ceramic cavity 51 to which the cover part 56 is fixed by means of the screws 55, the electrically connecting wiring lines 41, the protective film 35 and the anisotropic conductive sheets 70 are employed as the connecting devices for laminating and connecting together electronic parts comprising the chip parts, the insulating materials, the insulating layers and wiring layers and the electrically conductively connecting means have been described, it is to be noted that the present invention is not limited thereto. For instance, as shown in FIGS. 26A and 26B, bearing parts or bearing holes 86 may be employed, which are formed in such a way that through holes are formed on a multilayer multichip module 85, the bored through holes are filled with an electrically conductive adhesive agent, or an electrically conductive metal is plated on the inner peripheral surfaces of the through holes. Thus, where respective multichip modules 85A to 85C are electrically connected together, a short circuit can be prevented from occurring between the bearing parts or through holes 86 and external terminals 87 and or a plurality of electrodes of a mother board, for example, when the multilayer multichip module 85 is mounted on the mother board (not shown), because the bearing parts or through holes 86 are formed on one side opposed to the other side on which the external terminals 87 are provided.

Besides, although, in the first to third embodiments, the cases in which the electronic parts of the present invention are applied to the multichip module 10 have been described, it is to be understood that the present invention is not limited thereto, and the electronic parts may be applied to various kinds of other electronic devices on which a variety of chip parts are provided.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An electronic device comprising:
   a plurality of chip parts having protrusion electrodes respectively provided on the circuit surfaces;
   insulating material integrally sealing said plurality of chip parts and fixing same relative to one another with said circuit surfaces being directed in the same direction, said insulating material covering said circuit surfaces but leaving exposed the protrusion electrodes;
   insulating layers and patterned wiring layers which are sequentially and alternately laminated on said insulating material;
   first conductively connecting means for conductively connecting said protrusion electrodes and corresponding portions of said patterned wiring layers; and
   second conductively connecting means for conductively connecting between the patterned wiring layers.

2. The electronic device according to claim 1, wherein at least, one external terminal being an end part of said patterned wiring layers is provided at one side of said patterned wiring layers.

3. The electronic device according to claim 1, wherein at least, one external terminal being an end part of said patterned wiring layers is provided at one side of the wiring layers which are positioned and at the patterned wiring layer furthest from said chip parts.

4. An electronic device having a connecting means for connecting a plurality of electronic devices which are laminated and arranged, said electronic device comprising:

a plurality of chip parts having protrusion electrodes respectively provided on on circuit surfaces thereof;

insulating material sealing said plurality of chip parts together and fixing same relative to one another, said circuit surfaces being nearly directed in the same direction said insulating material covering said circuit surfaces but leaving exposed the protrusion electrodes;

insulating layers and patterned wiring layers sequentially and alternately laminated on said insulating material;

first conductively connecting means for conductively connecting said protrusion electrodes and corresponding portions of said patterned wiring layers; and second conductively connecting means for conductively connected between patterned wiring layers.

5. The electronic device according to claim 4, wherein said connecting means conductively connects between said patterned wiring layers on the peripheral side surfaces of said respective electronic devices which are laminated and arranged.

6. A method for manufacturing electronic devices comprising:

integrally sealing and fixing together a plurality of chip parts having circuit surfaces and electrodes protruding from said circuit surfaces, which are arranged with said circuit surfaces nearly directed in the same direction, so as to cover said circuit surfaces while leaving exposed the protrusion electrodes;

sequentially and alternately laminating and forming on said insulating material insulating layers and patterned wiring layers; and conductively connecting said protrusion electrodes and corresponding portion of said wiring layers.

7. The method for manufacturing electronic device according to claim 6, wherein at least, one external terminal being an end part of said patterned wiring layers is provided at one side of said patterned wiring layers.

8. The method for manufacturing electronic device according to claim 6, wherein at least, one external terminal being an end part of said patterned wiring layers is provided at one side of the patterned wiring layers at the patterned wiring layer furthest away from said chip parts.

9. A method for manufacturing electronic device comprising the steps of:

integrally sealing and fixing together a plurality of chip parts having circuit surfaces and electrodes protruding from said circuit surfaces, which are arranged with said circuit surfaces nearly directed in the same direction, so as to cover said circuit surfaces while leaving exposed the protrusion electrodes;

sequentially and alternately laminating and forming on said insulating material insulating layers and patterned wiring layers;

conductively connecting said protrusion electrodes and corresponding portion of said wiring layers; and laminating said insulating materials of which said insulating layers and said patterned wiring layers are laminated and formed in the direction of its thickness, and of electrically connecting said chip parts which are sealed with said insulating material and said chip parts which are sealed with other insulating material.

10. The method for manufacturing electronic device according to claim 9, comprising the further steps of:

a step of providing, at least, one external terminal being an end part of the patterned wiring layers on the uppermost patterned wiring layer of the predetermined insulating material of said insulating material; and a step of arranging at the uppermost stage the insulating materials, on which said external terminal is provided, of said insulating materials, and of forming the prescribed wiring patterns for conductively connecting a predetermined wiring layer of said wiring layers with the peripheral side surface of said insulating materials on the side facing to the side where said external terminal is positioned.

* * * * *